(12) United States Patent
Oh et al.

(10) Patent No.: US 9,818,707 B2
(45) Date of Patent: Nov. 14, 2017

(54) STACKED MEMORY CHIP HAVING REDUCED INPUT-OUTPUT LOAD, MEMORY MODULE AND MEMORY SYSTEM INCLUDING THE SAME

(71) Applicants: Ki-Seok Oh, Seoul (KR); Doo-Hee Hwang, Seongnam-si (KR); Dong-Yang Lee, Yongin-si (KR); Jong-Hyun Choi, Suwon-si (KR)

(72) Inventors: Ki-Seok Oh, Seoul (KR); Doo-Hee Hwang, Seongnam-si (KR); Dong-Yang Lee, Yongin-si (KR); Jong-Hyun Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/960,909

(22) Filed: Dec. 7, 2015

(65) Prior Publication Data
US 2016/0181214 A1 Jun. 23, 2016

(30) Foreign Application Priority Data
Dec. 22, 2014 (KR) .................. 10-2014-0185695

(51) Int. Cl.
*H01L 23/52* (2006.01)
*H01L 23/00* (2006.01)
(Continued)

(52) U.S. Cl.
CPC ............ *H01L 24/06* (2013.01); *G11C 7/1051* (2013.01); *G11C 7/1078* (2013.01);
(Continued)

(58) Field of Classification Search
CPC ...... G11C 11/02; G11C 13/0002; H01L 45/04; H01L 45/06; H01L 45/10; H01L 27/222;
(Continued)

(56) References Cited

U.S. PATENT DOCUMENTS 7,262,506 B2 8/2007 Mess et al.
7,276,799 B2 10/2007 Lee et al.
(Continued)

FOREIGN PATENT DOCUMENTS

KR 20130035442 A 4/2013
KR 20130044048 A 5/2013
(Continued)

*Primary Examiner* — A. Sefer
(74) *Attorney, Agent, or Firm* — Harness, Dickey & Pierce, P.L.C.

(57) ABSTRACT

A stacked memory chip includes a chip input-output pad unit, a first semiconductor die and a second semiconductor die. The chip input-output pad unit includes a chip command-address pad unit, a lower chip data pad unit and an upper chip data pad unit that are to be connected to an external device. The first semiconductor die electrically is connected to the chip command-address pad unit and the lower chip data pad unit and electrically disconnected from the upper chip data pad unit. The second semiconductor die electrically is connected to the chip command-address pad unit and the upper chip data pad unit and electrically disconnected from the lower chip data pad unit. The input-output load may be reduced by selectively connecting each of the stacked semiconductor dies to one of the lower chip data pad unit and the upper chip data pad unit.

19 Claims, 32 Drawing Sheets

(51) Int. Cl.
    *H01L 25/065*     (2006.01)
    *H01L 27/18*     (2006.01)
    *H01L 45/00*     (2006.01)
    *H01L 27/22*     (2006.01)
    *H01L 27/24*     (2006.01)
    *G11C 7/10*     (2006.01)

(52) U.S. Cl.
    CPC .......... *H01L 25/0657* (2013.01); *H01L 27/18* (2013.01); *H01L 27/222* (2013.01); *H01L 27/2481* (2013.01); *H01L 45/04* (2013.01); *H01L 45/06* (2013.01); *H01L 45/10* (2013.01); *G11C 2207/105* (2013.01); *H01L 2224/09515* (2013.01); *H01L 2225/0651* (2013.01); *H01L 2225/06513* (2013.01); *H01L 2225/06517* (2013.01); *H01L 2225/06565* (2013.01); *H01L 2924/1434* (2013.01)

(58) Field of Classification Search
    CPC . H01L 27/2481; H01L 24/06; H01L 25/0657; H01L 27/18; H01L 2225/0651; H01L 2924/1434; H01L 2225/06513; H01L 2225/06565; H01L 2224/09515; H01L 2225/065
    See application file for complete search history.

(56) References Cited

U.S. PATENT DOCUMENTS

| | | | |
|---|---|---|---|
| 7,298,032 B2 | 11/2007 | Kim et al. | |
| 7,309,923 B2 | 12/2007 | Kee | |
| 7,315,078 B2 | 1/2008 | Huang | |
| 7,317,256 B2 | 1/2008 | Williams et al. | |
| 7,531,905 B2 | 5/2009 | Ishino et al. | |
| 7,902,879 B2 | 3/2011 | Ozguz et al. | |
| 8,159,062 B2 | 4/2012 | Masuda et al. | |
| 8,253,244 B2 | 8/2012 | Kang | |
| 8,399,973 B2 | 3/2013 | Oh et al. | |
| 2010/0039847 A1* | 2/2010 | Yano | H01L 23/49575 365/51 |
| 2011/0148469 A1* | 6/2011 | Ito | G11C 5/04 327/77 |
| 2012/0086125 A1* | 4/2012 | Kang | H01L 21/6835 257/738 |
| 2012/0261837 A1* | 10/2012 | Inoue | H01L 23/49838 257/777 |
| 2013/0099235 A1 | 4/2013 | Han | |
| 2013/0114329 A1 | 5/2013 | Nickel et al. | |
| 2013/0182485 A1* | 7/2013 | Oh | G11C 5/02 365/63 |
| 2013/0307164 A1* | 11/2013 | Silvestri | H01L 24/49 257/777 |
| 2014/0138851 A1* | 5/2014 | Kim | H01L 25/0652 257/777 |
| 2015/0085596 A1* | 3/2015 | Cho | G11C 8/12 365/226 |

FOREIGN PATENT DOCUMENTS

| | | |
|---|---|---|
| KR | 20130050077 A | 5/2013 |
| KR | 20140023023 A | 2/2014 |

\* cited by examiner

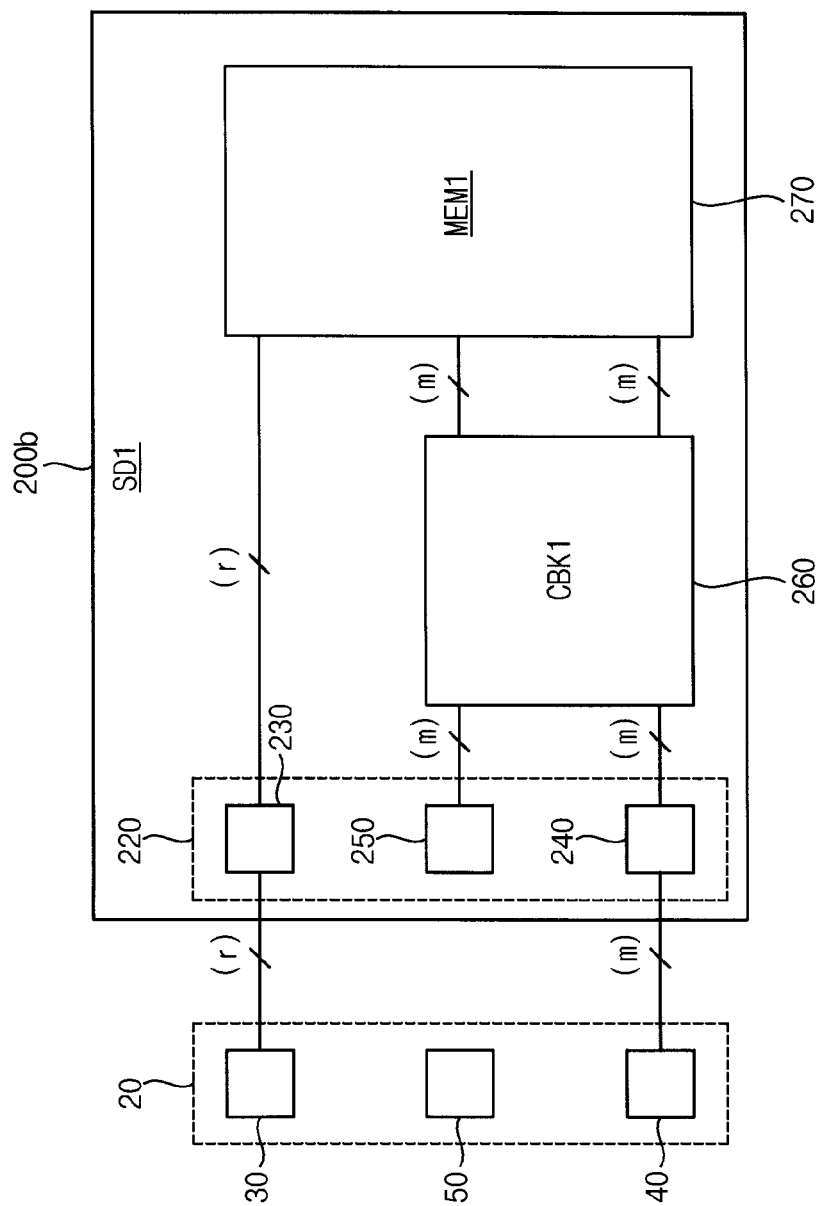

|       | CS | Rn | ICS1 | ICS2 | PSEL1 | PSEL2 |
|-------|----|----|------|------|-------|-------|
| CASE1 | H  | H  | H    | H    | H     | H     |
| CASE2 | H  | L  | H    | H    | L     | L     |
| CASE3 | L  | X  | L    | L    | L     | L     |

|  | CS1 | CS2 | ICS1 | ICS2 | PSEL1 | PSEL2 |
|---|---|---|---|---|---|---|
| CASE1 | H | L | H | H | H | H |
| CASE2 | L | H | H | H | L | L |
| CASE3 | L | L | L | L | L | L |

FIG. 17C

|       | CS1 | CS2 | ICS1 | ICS2 | PSEL1 | PSEL2 |
|-------|-----|-----|------|------|-------|-------|
| CASE1 | H   | L   | H    | H    | H     | L     |
| CASE2 | L   | H   | H    | H    | L     | H     |
| CASE3 | L   | L   | L    | L    | L     | L     |

FIG. 23

| MEMORY DENSITY (PER DIE) | | 4Gb | 8Gb | 16Gb |
|---|---|---|---|---|
| MEMORY DENSITY (PER CHANNEL) | | 2Gb | 4Gb | 8Gb |
| BANK ADDRESS | | BA0-BA2 | BA0-BA2 | BA0-BA2 |
| X16 | ROW ADDRESS | R0-R13 | R0-R14 | R0-R15 |
| | COLUMN ADDRESS | C0-C9 | C0-C9 | C0-C9 |

FIG. 24

| COMMAND | CS | CA0 | CA1 | CA2 | CA3 | CA4 | CA5 | CK EDGE |
|---|---|---|---|---|---|---|---|---|
| ACT1 | H | H | L | R12 | R13 | R14 | R15 | R1 |
|  | L | BA0 | BA1 | BA2 | V | R10 | R11 | R2 |
| ACT2 | H | H | H | R6 | R7 | R8 | R9 | R1 |
|  | L | R0 | R1 | R2 | R3 | R4 | R5 | R2 |
| WR1 | H | L | L | H | L | L | BL | R1 |
|  | L | BA0 | BA1 | BA2 | V | C9 | AP | R2 |
| RD1 | H | L | H | L | L | L | BL | R1 |
|  | L | BA0 | BA1 | BA2 | V | C9 | AP | R2 |
| CAS2 | H | L | H | L | L | H | C8 | R1 |
|  | L | C2 | C3 | C4 | C5 | C6 | C7 | R2 |

STACKED MEMORY CHIP HAVING REDUCED INPUT-OUTPUT LOAD, MEMORY MODULE AND MEMORY SYSTEM INCLUDING THE SAME

CROSS-REFERENCE TO RELATED APPLICATION

This U.S. Non-provisional application claims priority under 35 USC §119 to Korean Patent Application No. 10-2014-0185695, filed on Dec. 22, 2014, in the Korean Intellectual Property Office (KIPO), the disclosure of which is incorporated by reference in its entirety herein.

BACKGROUND

Example embodiments relate generally to semiconductor integrated circuits. For example, at least some example embodiments relate to a stacked memory chip having a reduced input-output load, a memory module and/or a memory system including the stacked memory chip.

Due to developments in hardware and software, there may be increased demand for main memory having increased capacity and/or operating speed. To increase the memory capacity, semiconductor dies or semiconductor chips may be stacked in a package of a memory chip. The memory chip includes input-output pads for exchanging signals with an external device. Conventionally, the stacked semiconductor dies may be commonly connected to the input-output pads and one of the semiconductor dies may be selected and accessed based on chip selection signals. As the number of the semiconductor dies commonly connected to the input-output pads increases, the load of the input-output lines may also increase. The increased load may limit the operation speed of the memory chip and may increase the input-output power.

SUMMARY

At least one example embodiment of the inventive concepts relate to a stacked memory device having a reduced input-output load.

At least one example embodiment of the inventive concepts relate to a memory module including a stacked memory device having a reduced input-output load.

At least one example embodiment of the inventive concepts relate to a memory system including a stacked memory device having a reduced input-output load.

According to some example embodiments, a stacked memory chip includes a chip input-output pad unit, a first semiconductor die and a second semiconductor die. The chip input-output pad unit includes a chip command-address pad unit, a lower chip data pad unit and an upper chip data pad unit that are to be connected to an external device. The first semiconductor die electrically is connected to the chip command-address pad unit and the lower chip data pad unit and electrically disconnected from the upper chip data pad unit. The second semiconductor die electrically is connected to the chip command-address pad unit and the upper chip data pad unit and electrically disconnected from the lower chip data pad unit.

The first semiconductor die and the second semiconductor die may include die input-output pad units of a same configuration, respectively, and each die input-output pad unit may include a die command-address pad unit corresponding to the chip command-address pad unit, a lower die data pad unit corresponding to the lower chip data pad unit and an upper die data pad unit corresponding to the upper chip data pad unit.

The upper die data pad unit of the first semiconductor die may be floated and electrically disconnected from a memory region in the first semiconductor die, and the lower die data pad unit of the second semiconductor die may be floated and electrically disconnected from a memory region in the second semiconductor die.

Each of the first semiconductor die and the second semiconductor die may include a die input-output pad unit, a memory region and a conversion block. The die input-output pad unit may include a die command-address pad unit corresponding to the chip command-address pad unit, a lower die data pad unit corresponding to the lower chip data pad unit and an upper die data pad unit corresponding to the upper chip data pad unit. The memory region may include a memory core and an input-output buffer configured to buffer data exchanged between the memory core and the die input-output pad unit, where a plurality of memory cells are formed in the memory core. The conversion block may control an electrical connection of the input-output buffer to the lower die data pad unit and the upper die data pad unit. The input-output buffer of the memory region may include a lower input-output buffer corresponding to the lower die data pad unit and an upper input-output buffer corresponding to the upper die data pad unit.

The conversion block may include a switch block connected to the lower input-output buffer and the upper input-output buffer, a first fuse array connected between the switch block and the lower die data pad unit and a second fuse array connected between the switch block and the upper die data pad unit. One of the first fuse array and the second fuse array may be cut selectively.

The second fuse array of the first semiconductor die may be cut and the upper die data pad unit of the first semiconductor die may be floated, and the first fuse array of the second semiconductor die may be cut and the lower die data pad unit of the second semiconductor die may be floated.

The conversion block may electrically connect one of the lower input-output buffer and the upper input-output buffer to the die input-output pad unit selectively in response to a path selection signal.

One of the lower input-output buffer and the upper input-output buffer may be enabled selectively in response to a path selection signal.

The first semiconductor die and the second semiconductor die may receive a common chip selection signal and selected simultaneously when the common chip selection signal is activated.

The stacked memory chip may further include a path controller configured to generate a path selection signal based on the common chip selection signal and a most significant address bit signal. One of the lower input-output buffer and the upper input-output buffer may be electrically connected to the die input-output pad unit selectively in response to the path selection signal.

Each of the first semiconductor die and the second semiconductor die may receive a first chip selection signal and a second chip selection signal and selected simultaneously when one of the first chip selection signal and the second chip selection signal is activated.

The stacked memory chip may further include a path controller configured to generate a path selection signal based on the first chip selection signal and the second chip selection signal. One of the lower input-output buffer and the upper input-output buffer may be electrically connected to the die input-output pad unit selectively in response to the path selection signal.

The stacked memory chip may further include a third semiconductor die electrically connected to the chip command-address pad unit and the lower chip data pad unit and electrically disconnected from the upper chip data pad unit and a fourth semiconductor die electrically connected to the chip command-address pad unit and the upper chip data pad unit and electrically disconnected from the lower chip data pad unit.

The first semiconductor die and the second semiconductor die may receive a first common chip selection signal and selected simultaneously when the first common chip selection signal is activated. The third semiconductor die and the fourth semiconductor die may receive a second common chip selection signal and selected simultaneously when the second common chip selection signal is activated.

The third semiconductor die may be stacked directly on the first semiconductor die and fourth semiconductor die may be stacked directly on the second semiconductor die.

The second semiconductor die may be stacked directly on the first semiconductor die and fourth semiconductor die may be stacked directly on the third semiconductor die.

Each of the first semiconductor die and the second semiconductor die may include a first channel region and a second channel region that are operated independently of each other.

The stacked memory chip may receive a command and an address through the chip command-address pad unit during a plurality of clock cycles.

The first semiconductor die may exchange data of m bits in parallel with the lower chip data pad unit and simultaneously the second semiconductor die may exchange data of m bits in parallel with the upper chip data pad unit. The chip input-output pad unit may exchange the data of 2 m bits in parallel with the external device.

The first semiconductor die and the second semiconductor die may be electrically connected to the lower chip data pad unit and the upper chip data pad unit through bonding wires.

The first semiconductor die and the second semiconductor die may be electrically connected to the chip command-address pad unit using through-silicon vias.

According to other example embodiments, a memory system includes a memory controller and at least one stacked memory chip controlled by the memory controller. The stacked memory chip includes a chip input-output pad unit including a chip command-address pad unit, a lower chip data pad unit and an upper chip data pad unit that are connected to the memory controller and a plurality of semiconductor dies. All of the semiconductor dies are electrically connected to the chip command-address pad unit, each of the semiconductor dies is electrically connected to one of the lower chip data pad unit and the upper chip data pad unit and electrically disconnected from the other of the lower chip data pad unit and the upper chip data pad unit.

The memory controller may control an access to the stacked memory chip through chip selection signals and address bit signals such that a number of the chip selection signal corresponds to a half number of the semiconductor dies and the address bit signals correspond to two times of memory capacity of each semiconductor die.

The memory controller may control an access to the stacked memory chip through chip selection signals and address bit signals such that a number of the chip selection signal corresponds to a number of the semiconductor dies and the address bit signals correspond to memory capacity of each semiconductor die.

According to other example embodiments, a memory module includes a module substrate and a plurality of memory chips mounted on the memory substrate. Each of the memory chips includes a chip input-output pad unit including a chip command-address pad unit, a lower chip data pad unit and an upper chip data pad unit that are to be connected to an external device, a first semiconductor die electrically connected to the chip command-address pad unit and the lower chip data pad unit and electrically disconnected from the upper chip data pad unit, and a second semiconductor die electrically connected to the chip command-address pad unit and the upper chip data pad unit and electrically disconnected from the lower chip data pad unit.

In some example embodiments, the memory chips may include at least one of the flash memory having a three-dimensional memory array.

In some example embodiments, the three-dimensional memory includes a non-volatile memory that is monolithically formed in one or more physical levels of memory cells having active areas disposed above a silicon substrate.

In some example embodiments, the three dimensional memory array includes a plurality of memory cells, each of the memory cells including a charge trap layer.

In some example embodiments, word lines and/or bit lines in the three-dimensional memory array are shared between levels.

The stacked memory chip, the memory module and the memory system according to example embodiments may reduce the input-output load by selectively connecting each of the stacked semiconductor dies to one of the lower chip data pad unit and the upper chip data pad unit, to increase the operation speed and decrease the power consumption. Through such reduction of the input-output load, the number of the stacked semiconductor dies may be further increased and the memory device of a higher memory capacity may be implemented efficiently.

BRIEF DESCRIPTION OF THE DRAWINGS

Example embodiments of the inventive concepts will be more clearly understood from the following detailed description taken in conjunction with the accompanying drawings.

FIGS. 4A and 4B are diagrams illustrating semiconductor dies included in the stacked memory chip of FIG. 1.

FIGS. 17A, 17B and 17C are diagrams for describing an example path control of the memory chip of FIG. 16.

FIG. 23 is a diagram for describing an addressing scheme of the stacked memory chip of FIG. 22.

FIG. 24 is a diagram illustrating a portion of commands in the stacked memory chip of FIG. 22.

DETAILED DESCRIPTION

Figure 1:
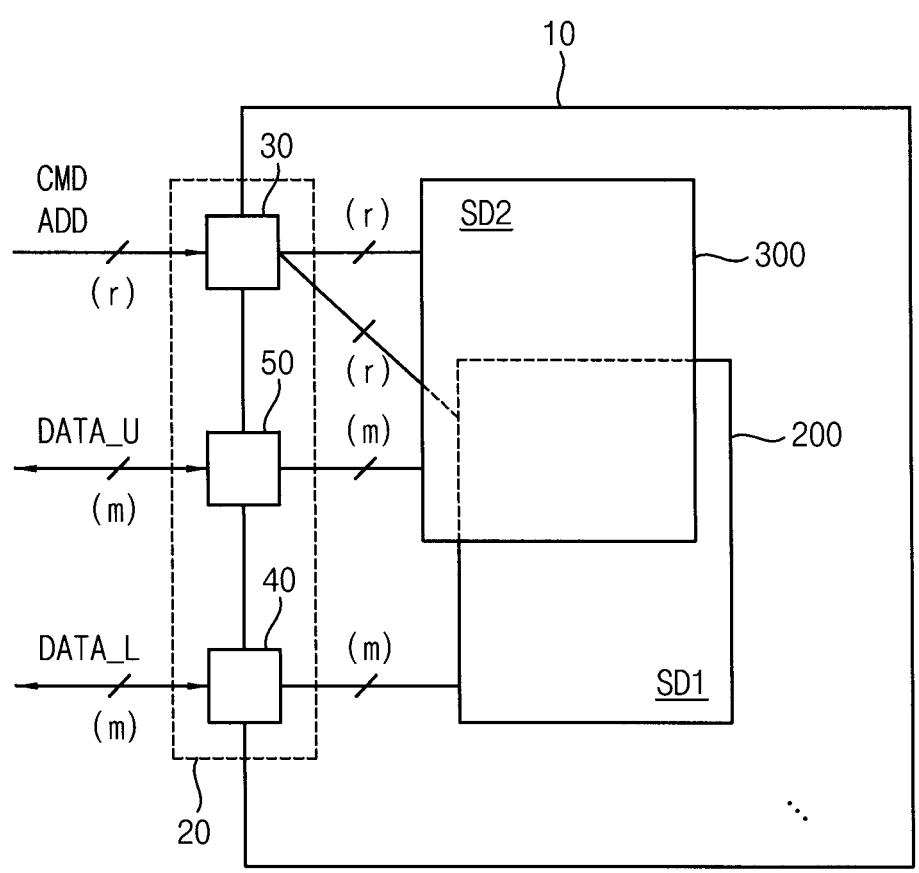
FIG. 1 is a block diagram illustrating a stacked memory chip according to example embodiments.

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the example embodiments of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a stacked memory chip according to example embodiments.

Referring to FIG. 1, a stacked memory chip 10 may include a chip input-output (I/O) pad unit 20 and a plurality of semiconductor dies. For example, as illustrated in FIG. 1, the plurality of semiconductor dies may include a first semiconductor die SD1 200 and a second semiconductor die SD2 300. However, example embodiments are not limited thereto. For example, three or more semiconductor dies may be packaged in the single memory chip 10.

In an example embodiment, the stacked memory chip 10 may be a three dimensional (3D) memory array. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an example embodiment, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,507; 0,559,235; and U.S. Pat. Pub. No. 2011/0233648.

The chip input-output pad unit 20 includes a chip command-address pad unit 30, a lower chip data pad unit 40 and an upper chip data pad unit 50 that are to be connected to an external device. Each of the chip command-address pad unit 30, the lower chip data pad unit 40 and the upper chip data pad unit 50 may include a plurality of pads. For example, the chip command-address pad unit 30 may include r pads for receiving a command CMD and an address ADD from the external device such as a memory controller, the lower chip data pad unit 40 may include in pads for exchanging lower data DATA_L of in bits with the external device, and the upper chip data pad unit 50 may include m pads for exchanging upper data DATA_U of m bits with the external device. In some example embodiments, r and m may be natural numbers.

The chip command-address pad unit 30 may include the r pads for receiving a chip selection signal, a clock enable signal, a row access strobe (RAS) signal, a column access strobe (CAS) signal, a write enable signal, address signals, etc. The type and number of the command-address pads may be varied according to the type and configuration of the memory integrated in the semiconductor die. In FIG. 1 voltage pads, clock pads, etc. are omitted for convenience of illustration, however, these pads may be included in the chip command-address pad unit 30.

The first semiconductor die 200 may be electrically connected to the chip command-address pad unit 30 and the lower chip data pad unit 40 and electrically disconnected from the upper chip data pad unit 50. The second semiconductor die 300 may be electrically connected to the chip command-address pad unit 30 and the upper chip data pad unit 50 and electrically disconnected from the lower chip data pad unit 40.

The first semiconductor die 200 may exchange or communicate the lower data DATA_L of m bits with the lower chip data pad unit 40. Further, the second semiconductor die 300 may exchange or communicate the upper data DATA_U of m bits with the upper chip data pad unit 50.

The first semiconductor die 200 may exchange the lower data DATA_L in parallel and simultaneously with the second semiconductor die 300 exchange of the upper data DATA_U. Accordingly the chip input-output pad unit 30 may exchange the data DATA_L and DATA_U of 2 m bits with the external device in parallel. In some example embodiments, each of the lower data DATA_L and the upper data DATA_U may be eight-bit data or one byte data and the memory chip 10 may exchange one word data with the external device. In other example embodiments, each of the lower data DATA_L and the upper data DATA_U may be multi-byte data and the memory chip 10 may exchange multi-word data with the external device.

In the conventional package, the semiconductor dies may be commonly connected to one or more chip data pad units, and one of the semiconductor dies may be selected and accessed based on the chip selection signals. In contrast, in one or more example embodiments, each of the semiconductor dies 200 and 300 may be connected to one of the lower chip data pad unit 40 and the upper chip data pad unit 50 and, thus, the input-output load may be reduced resulting in an increase in the operating speed and a decrease in the power consumption. Through such reduction of the input-output load, the number of the stacked semiconductor dies may be further increased and, thus, the memory device of a higher memory capacity may be implemented efficiently.

Figure 2:
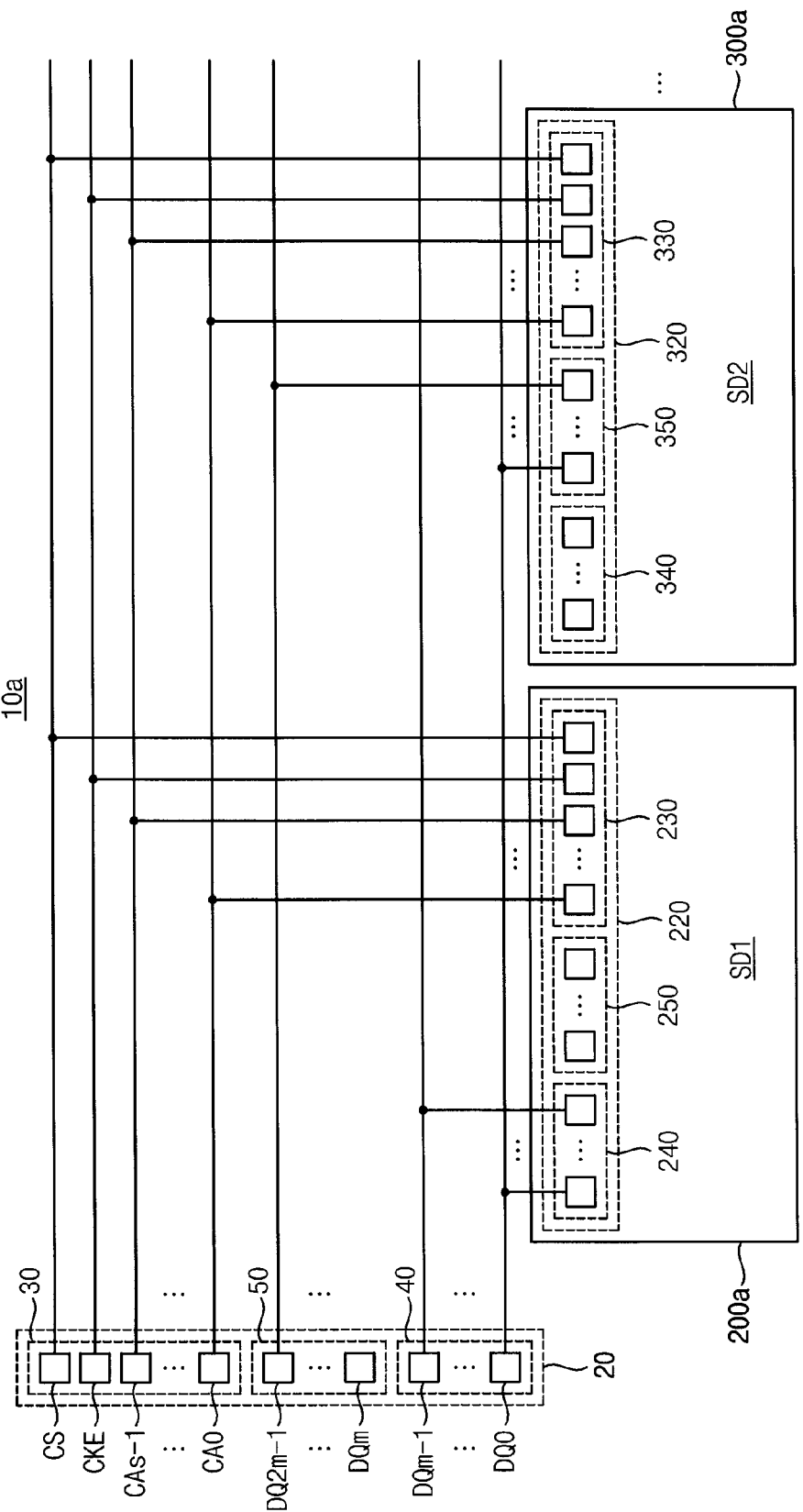
FIG. 2 is a circuit diagram illustrating a stacked memory chip according to example embodiments.
Figure 3:
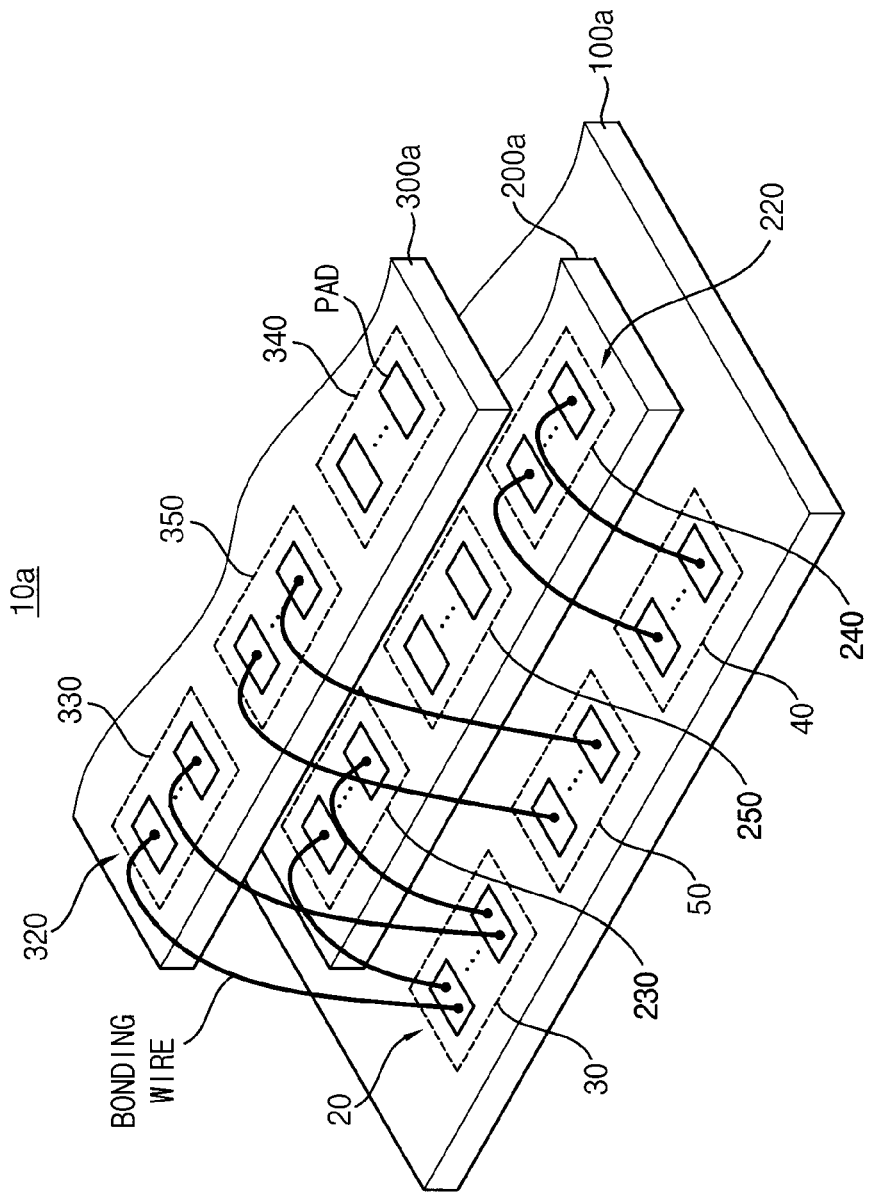
FIG. 3 is a diagram illustrating an example connection of pads of a stacked memory chip according to example embodiments.

FIG. 2 is a circuit diagram illustrating a stacked memory chip according to example embodiments, and FIG. 3 is a diagram illustrating an example connection of pads of a stacked memory chip according to example embodiments.

Referring to FIGS. 2 and 3, a stacked memory chip 10a includes abuse substrate 100a and a plurality of semiconductor dies mounted on the base substrate 100a. For example, as illustrated in FIGS. 2 and 3, the plurality of semiconductor dies may include a first semiconductor die SD1 200a and a second semiconductor die SD2 300a, however, example embodiments are not limited thereto. For example, three or more semiconductor dies may be packaged in the single memory chip 10a.

The base substrate 100a includes a chip input-output pad unit 20, and the chip input-output pad unit 20 includes a chip command-address pad unit 30, a lower chip data pad unit 40 and an upper chip data pad unit 50 that are to be connected to an external device. For example, the chip command-address pad unit 30 may include a plurality of pads for receiving a chip selection signal CS, a clock enable signal CKE and command-address signals CA0~CAs−1. The lower chip data pad unit 40 may include m pads for communicating lower data DQ0~DQm−1 of m bits and the upper chip data pad unit 50 may include m pads for communicating upper data DQm~DQ2m−1 of m bits.

The first semiconductor die 200a and the second semiconductor die 300a include die input-output pad units 220 and 320 of a same configuration, respectively, and each of the die input-output pad units 220 and 320 may correspond to the chip input-output pad unit 20 such that each of the die input-output pad units 220 and 320 may include the same number of pads for communicating the same signals as the chip input-output pad unit 20.

The die input-output pad unit 220 of the first semiconductor die 200a includes a die command-address pad unit 230 corresponding to the chip command-address pad unit 30, a lower die data pad unit 240 corresponding to the lower chip data pad unit 40 and an upper die data pad unit 250 corresponding to the upper chip data pad unit 50. The die input-output pad unit 320 of the second semiconductor die 300a includes a die command-address pad unit 330 corresponding to the chip command-address pad unit 30, a lower die data pad unit 340 corresponding to the lower chip data pad unit 40 and an upper die data pad unit 350 corresponding to the upper chip data pad unit 50.

The die command-address pad unit 230 of the first semiconductor die 200a and the die command-address pad unit 330 of the second semiconductor die 300a may be connected commonly to the chip command-address pad unit 30. The lower die data pad unit 240 of the first semiconductor die 200a may be electrically connected to the lower chip data pad unit 40 and the upper die data pad unit 250 of the first semiconductor die 200a may be electrically disconnected from the upper chip data pad unit 50. The upper die data pad unit 350 of the second semiconductor die 300a may be electrically connected to the upper chip data pad unit 50 and the lower die data pad unit 340 of the second semiconductor die 300a may be electrically disconnected from the lower chip data pad unit 40.

Figure 11:
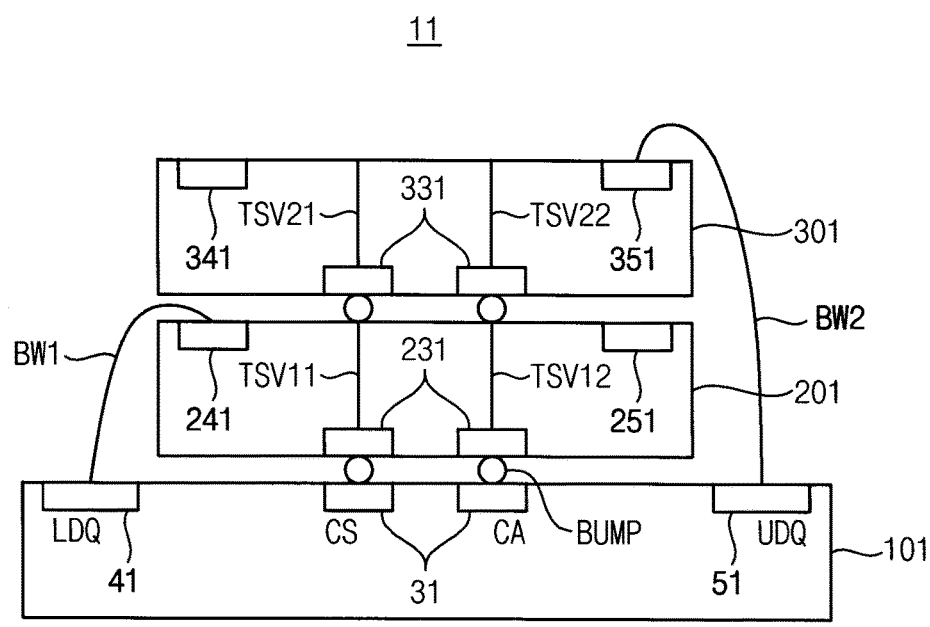
FIG. 11 is a cross-sectional diagram illustrating an example embodiment of a memory chip included in the memory system of FIG. 10.

As illustrated in FIG. 3, the first semiconductor die 200a and the second semiconductor die 300a may be connected to the lower chip data pad unit 40 and the upper chip data pad unit 50 through bonding wires, respectively. In addition, the first semiconductor die 200a and the second semiconductor die 300a may be connected commonly to the chip command-address pad unit 30 through the bonding wires. In other example embodiments, the first semiconductor die 200*a* and the second semiconductor die 300*a* may be connected commonly to the chip command-address pad unit 30 using through-silicon vias (TSV) as illustrated in FIG. 11.

Figure 4B:
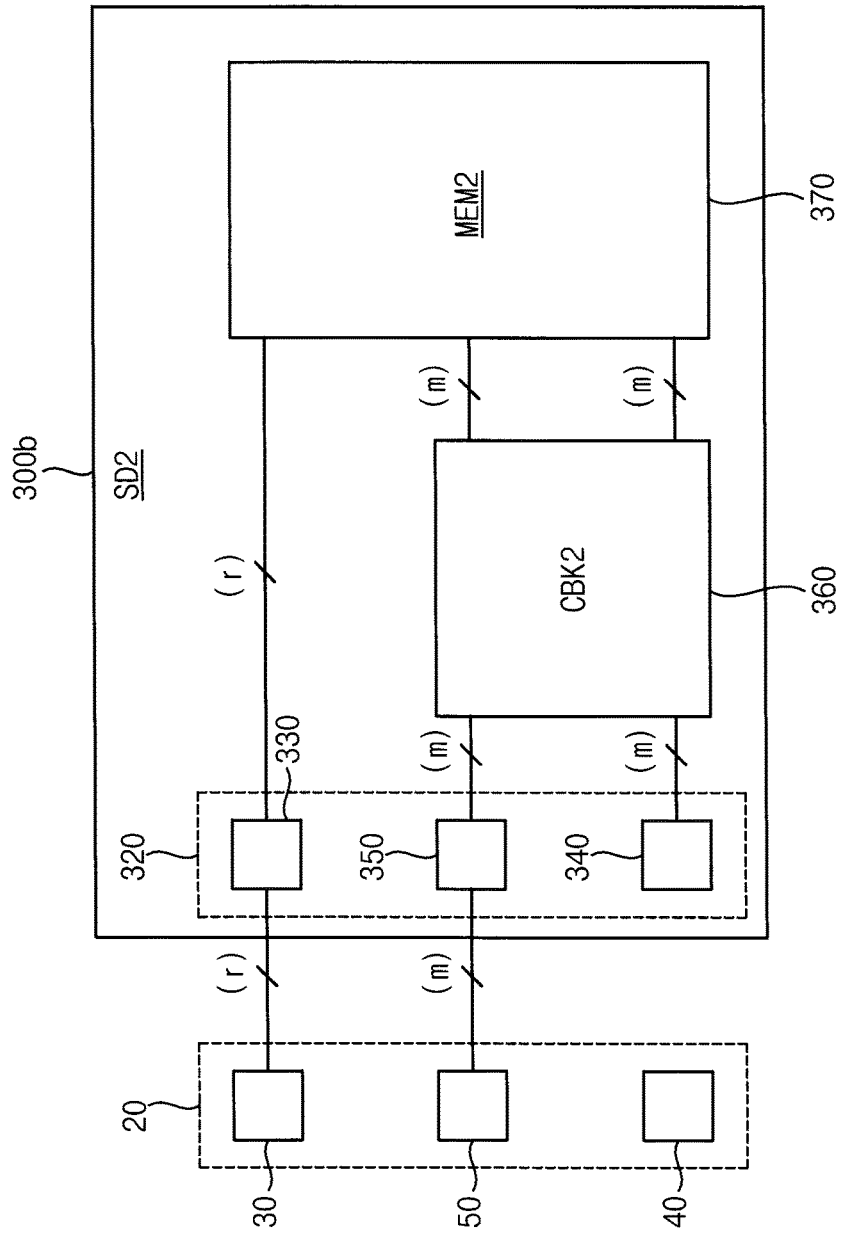

FIGS. 4A and 4B are diagrams illustrating semiconductor dies included in the stacked memory chip of FIG. 1.

Referring to FIG. 4A, a first semiconductor die SD1 200*b* may include a die input-output pad unit 220, a conversion block CBK1 260 and a memory region MEM1 270.

Figure 6:
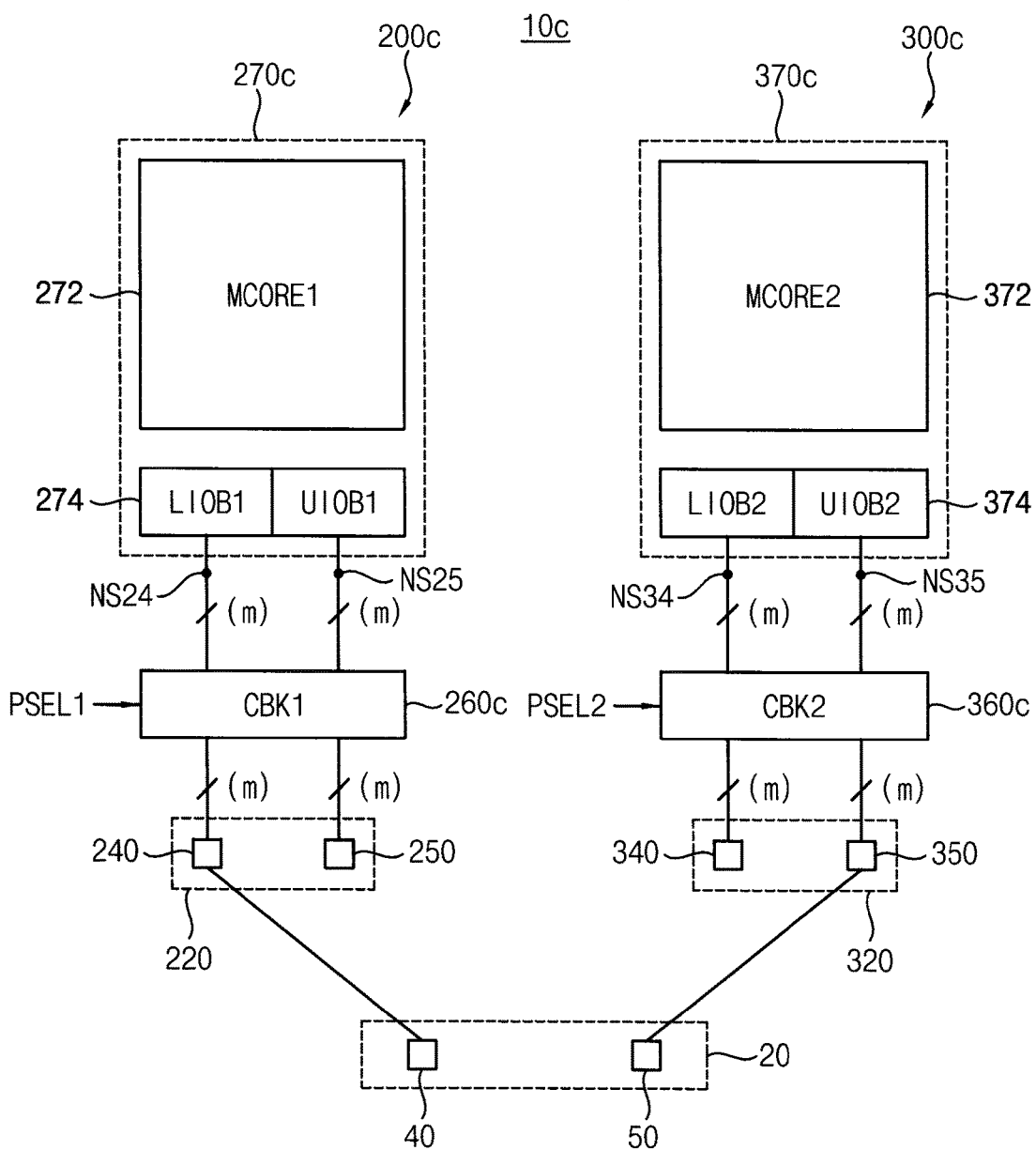
FIG. 6 is a block diagram illustrating a memory chip for describing a path conversion according to example embodiments.

The die input-output pad unit 220 of the first semiconductor die 200*b* may include a die command-address pad unit 230 corresponding to the chip command-address pad unit 30, a lower die data pad unit 240 corresponding to the lower chip data pad unit 40 and an upper die data pad unit 250 corresponding to the upper chip data pad unit 50. The conversion block 260 may control an electrical connection between the memory region 270 and the lower and upper die data pad units 240 and 250. In some example embodiments, the memory region 270 may include a memory core, in which a plurality of memory cells are formed, and an input-output buffer. As illustrated in FIG. 6, discussed below, the input-output buffer may be configured to buffer data exchanged between the memory core and the die input-output pad unit 220. In this case, the conversion block 260 may control an electrical connection between the input-output buffer and the lower and upper die data pad units 240 and 250.

Referring to FIG. 4B, a second semiconductor die SD2 300*b* may include a die input-output pad unit 320, a conversion block CBK2 360 and a memory region MEM2 370.

The die input-output pad unit 320 of the second semiconductor die 300*b* may include a die command-address pad unit 330 corresponding to the chip command-address pad unit 30, a lower die data pad unit 340 corresponding to the lower chip data pad unit 40 and an upper die data pad unit 350 corresponding to the upper chip data pad unit 50. The conversion block 360 may control an electrical connection between the memory region 370 and the lower and upper die data pad units 340 and 350. For example, as described above, the conversion block 360 may control an electrical connection between the input-output buffer in the memory region 370 and the lower and upper die data pad units 340 and 350.

As illustrated in FIGS. 4A and 4B, the die command-address pad unit 230 of the first semiconductor die 200*b* and the die command-address pad unit 330 of the second semiconductor die 300*b* may be connected commonly to the chip command-address pad unit 30. The lower die data pad unit 240 of the first semiconductor die 200*b* may be electrically connected to the lower chip data pad unit 40 and the upper die data pad unit 250 of the first semiconductor die 200*b* may be electrically disconnected from the upper chip data pad unit 50. The upper die data pad unit 350 of the second semiconductor die 300*b* may be electrically connected to the upper chip data pad unit 50 and the lower die data pad unit 340 of the second semiconductor die 300*b* may be electrically disconnected from the lower chip data pad unit 40.

As will be described below with reference to FIGS. 6 through 9, the upper die data pad unit 250 of the first semiconductor die 200*b* may be floated and electrically disconnected from the memory region 270 in the first semiconductor die 200*b*, and the lower die data pad unit 340 of the second semiconductor die 300*b* may be floated and electrically disconnected from the memory region 370 in the second semiconductor die 300*b*.

The input-output load may be reduced by selectively connecting each of the stacked semiconductor dies 200*b* and 300*b* to one of the lower chip data pad unit 40 and the upper chip data pad unit 50, thereby increasing the operation speed and decreasing the power consumption.

Figure 5:
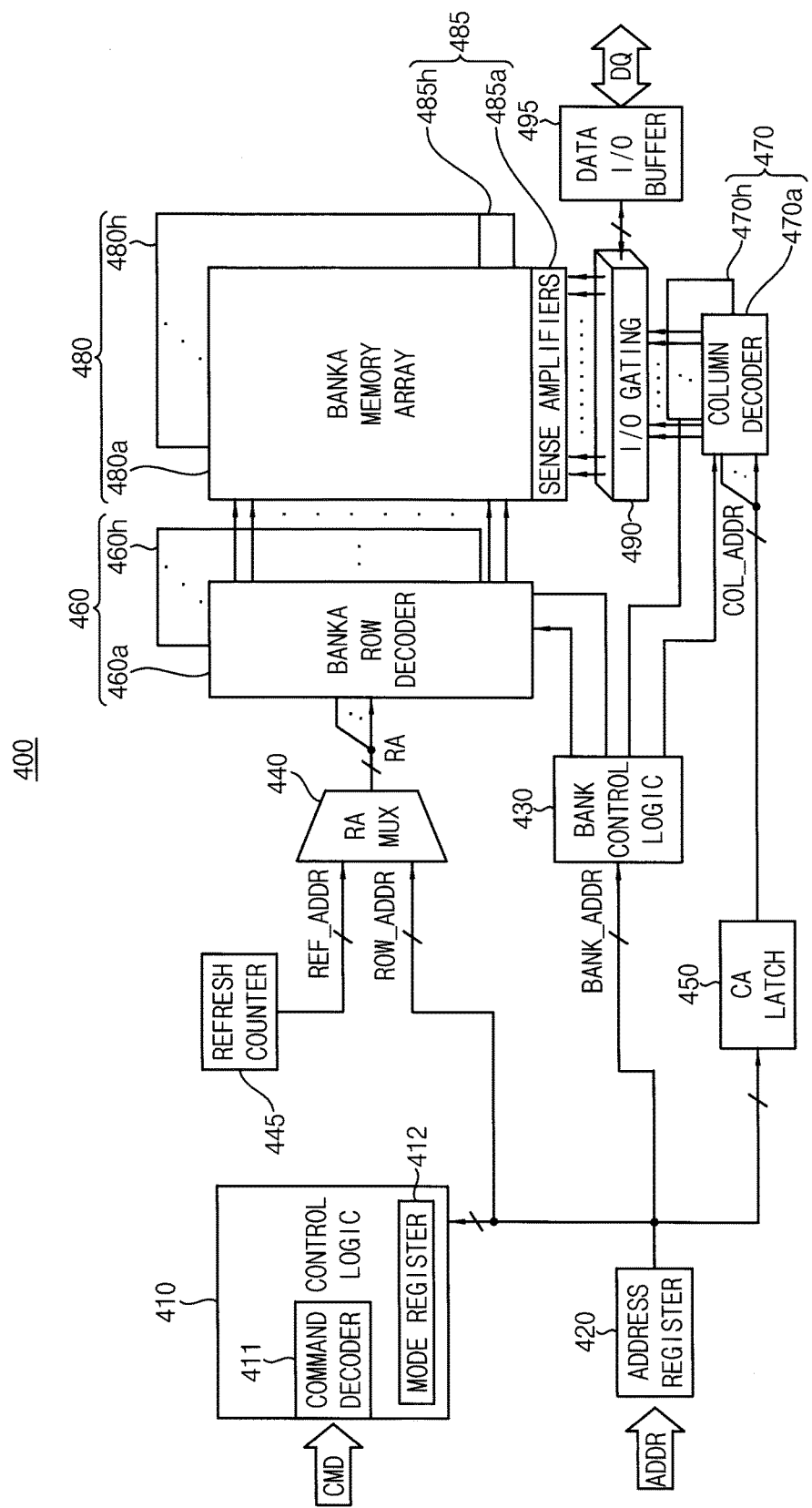
FIG. 5 is a block diagram illustrating an example of a memory region formed in each semiconductor die of FIGS. 4A and 4B.

FIG. 5 is a block diagram illustrating an example of a memory region formed in each semiconductor die of FIGS. 4A and 4B.

Referring to FIG. 5, the memory region 270, 370 included in each of the semiconductor dies 200*b*, 300*b* may be represented as a memory region 400. The memory region 400 (or, alternatively, the memory device) may include a control logic 410, an address register 420, a bank control logic 430, a row address multiplexer 440, a column address latch 450, a row decoder 460, a column decoder 470, a memory cell array 480, a sense amplifier unit 485, an input/output (I/O) gating circuit 490, a data input/output (I/O) buffer 495, and a refresh counter 445.

The memory cell array 480 may include a plurality of bank arrays 480*a*~480*h*. The row decoder 460 may include a plurality of bank row decoders 460*a*~460*h* respectively coupled to the bank arrays 480*a*~480*h*, the column decoder 470 may include a plurality of bank column decoders 470*a*~470*h* respectively coupled to the bank arrays 480*a*~480*h*, and the sense amplifier unit 485 may include a plurality of bank sense amplifiers 485*a*~485*h* respectively coupled to the bank arrays 480*a*~480*h*.

The address register 420 may receive an address ADDR including a bank address BANK_ADDR, a row address ROW_ADDR and a column address COL_ADDR from the memory controller. The address register 420 may provide the received bank address BANK_ADDR to the hank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460*a*~460*h* corresponding to the bank address BANK_ADDR may be activated in response to the bank control signals, and one of the bank column decoders 470*a*~470*h* corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460*a*~460*h*.

The activated one of the bank row decoders 460*a*~460*h* may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470*a*~470*h*.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by a sense amplifier 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation or a read operation. The control logic 410 may include a command decoder 411 that decodes a command CMD received from the memory controller via a buffer chip BC (see FIG. 26) and a mode register set 412 that sets an operation mode of the memory device.

For example, the command decoder 411 may generate the control signals corresponding to the command CMD by decoding a write enable signal, a row address strobe signal, a column address strobe signal, a chip selection signal, etc. The chip selection signal received by the command decoder 411 may be corresponding one of internal chip selection signals ICS1 and ICS2 as will be described below with reference to FIGS. 12A and 12B.

Hereinafter, a path conversion of a memory chip according to example embodiments are described with reference to FIGS. 6 through 9.

FIG. 6 is a block diagram illustrating a memory chip for describing a path conversion according to example embodiments.

Referring to FIG. 6, a memory chip 10c may include a chip input-output pad unit 20, a first semiconductor die 200c and a second semiconductor die 300c.

The first semiconductor die 200c may include a die input-output pad unit 220, a conversion block CBK1 260c and a memory region 270c. The memory region 270c may include a memory core MCORE1 272 in which a plurality of memory cells are formed, and an input-output buffer 274 that buffers the data exchanged between the memory core 272 and the die input-output pad unit 220. The input-output buffer 274 may include a lower input-output buffer LIOB1 corresponding to the lower die data pad unit 240 and an upper input-output buffer UIOB1 corresponding to the upper die data pad unit 250. The conversion block 260c may control an electrical connection between the lower and upper die data pad units 240 and 250 and the input-output buffer 274, that is, the nodes NS24 and NS25. As will be described below with reference to FIG. 7A, the conversion block 260c may electrically connect one of the lower input-output buffer LIOB1 and the upper input-output buffer UIOB1 selectively to the die input-output pad unit 220 in response to a first path selection signal PSEL1.

The second semiconductor die 300c may include a die input-output pad unit 320, a conversion block CBK2 360c and a memory region 370c. The memory region 370c may include a memory core MCORE2 372 in which a plurality of memory cells are formed and an input-output buffer 374 that buffers the data exchanged between the memory core 372 and the die input-output pad unit 320. The input-output buffer 374 may include a lower input-output buffer UIOB2 corresponding to the lower die data pad unit 340 and an upper input-output buffer UIOB2 corresponding to the upper die data pad unit 350. The conversion block 360c may control an electrical connection between the lower and upper die data pad units 340 and 350 and the input-output buffer 374, that is, the nodes NS34 and NS35. As will be described below with reference to FIG. 7B, the conversion block 360c may electrically connect one of the lower input-output buffer LIOB2 and the upper input-output buffer UIOB2 selectively to the die input-output pad unit 320 in response to a second path selection signal PSEL2.

As illustrated in FIG. 6, the lower die data pad unit 240 of the first semiconductor die 200c may be electrically connected to the lower chip data pad unit 40 and the upper die data pad unit 250 of the first semiconductor die 200c may be electrically disconnected from the upper chip data pad unit 50. The upper die data pad unit 350 of the second semiconductor die 300c may be electrically connected to the upper chip data pad unit 50 and the lower die data pad unit 340 of the second semiconductor die 300c may be electrically disconnected from the lower chip data pad unit 40. As such, the input-output load may be reduced by selectively connecting each of the stacked semiconductor dies 200c and 300c to one of the lower chip data pad unit 40 and the upper chip data pad unit 50, thereby increasing the operation speed and decreasing the power consumption.

Figure 7A:
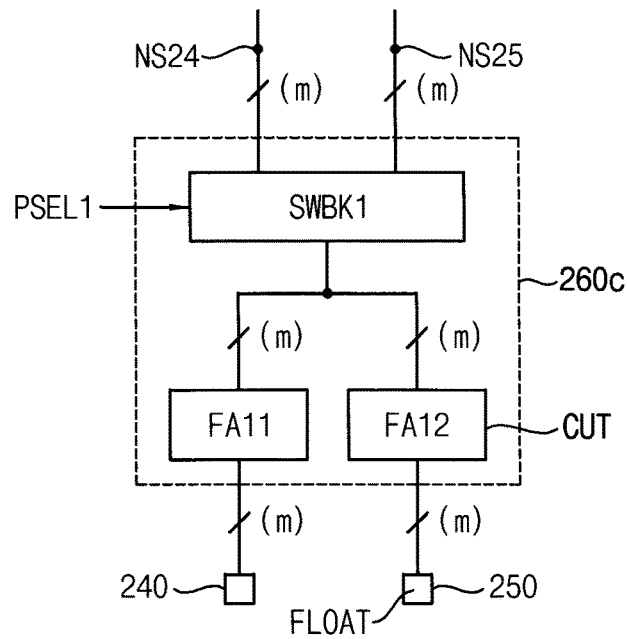
FIGS. 7A and 7B are diagrams illustrating conversion blocks included in semiconductor dies of the memory chip of FIG. 6.
Figure 7B:
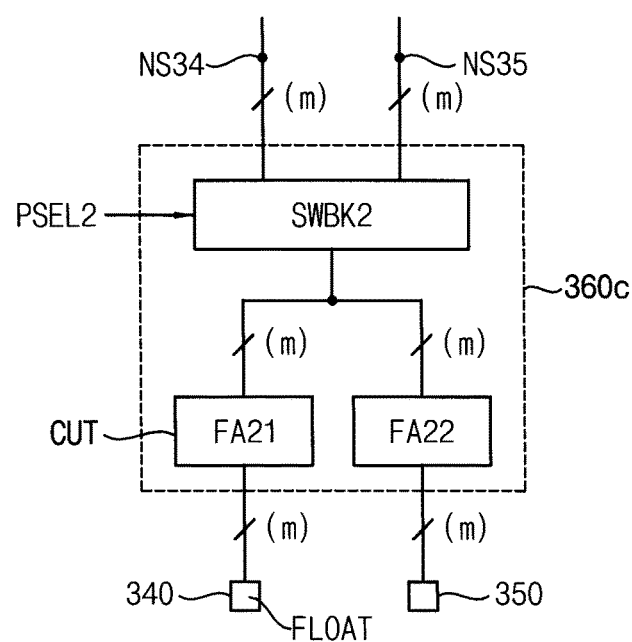

FIGS. 7A and 7B are diagrams illustrating conversion blocks included in semiconductor dies of the memory chip of FIG. 6.

Referring to FIG. 7A, the conversion block 260c of the first semiconductor die 200c may include a switch block SWBK1, a first fuse array FA11 and a second fuse array FA12. The switch block SWBK1 may be connected to the lower input-output buffer LIOB1 (i.e., the nodes NS24) and the upper input-output buffer UIOB1 (i.e., the nodes NS25). The first fuse array FA11 may be connected between the switch block SWBK1 and the lower die data pad unit 240. The second fuse array FA12 may be connected between the switch block SWBK1 and the upper die data pad unit 250.

Referring to FIG. 7B, the conversion block 360c of the second semiconductor die 300c may include a switch block SWBK2, a first fuse array FA21 and a second fuse array FA22. The switch block SWBK2 may be connected to the lower input-output buffer LIOB2 (i.e., the nodes NS34) and the upper input-output buffer UIOB2 (i.e., the nodes NS35). The first fuse array FA21 may be connected between the switch block SWBK2 and the lower die data pad unit 340. The second fuse array FA22 may be connected between the switch block SWBK2 and the upper die data pad unit 350.

Each of the conversion blocks 260c and 360c may electrically connect one of the lower input-output buffer LIOBi (i=1, 2) and the upper input-output buffer UIOBi selectively to each of the die input-output pad units 220 and 320 in response to the corresponding path selection signal PSELi. For example, the lower input-output buffer LIOBi may be electrically connected to each of the die input-output pad units 220 and 320 when the path selection signal PSELi is in the logic low level and the upper input-output buffer UIOBi may be electrically connected to each of the die input-output pad units 220 and 320 when the path selection signal PSELi is in the logic high level. In contrast, the lower input-output buffer LIOBi may be electrically connected to each of the die input-output pad units 220 and 320 when the path selection signal PSELi is in the logic high level and the upper input-output buffer UIOBi may be electrically connected to each of the die input-output pad units 220 and 320 when the path selection signal PSELi is in the logic low level.

One of the first fuse array and the second fuse array respectively included in the conversion blocks 260c and 360c may be cut selectively. For example, the second fuse array FA12 may be cut with respect to the conversion block 260c of the first semiconductor die 200c, but the first fuse array FA21 may be cut with respect to the conversion block 360c of the second semiconductor die 300c. The upper die data pad unit 250 of the first semiconductor die 200c may be floated because the second fuse array FA12 of the first semiconductor die 200c is cut and the lower die data pad unit 340 of the second semiconductor die 300c may be floated because the first fuse array FA21 of the second semiconductor die 300c is cut.

The switch blocks SWBK1 and SWBK2 may include a plurality of switches, for example, relays and/or transistors, configured to selectively connect one of the lower die data pads 240, 340 and upper die data pads 250, 350 to an appropriate one of the I/O buffers 274 associated with the memory core 272, namely, one of the lower I/O buffer LIOB1 and the upper I/O buffer UIOB1.

The fuse arrays FA may include fuse circuits configured to output a signal having different logic levels according to states of programmed fuses. The fuse circuits may include laser fuses, electrical fuses, and/or anti-fuses.

Through the switching operation of the switch blocks SWBK1 and SWBK2 and selective program of the fuse arrays FA11, FA12, FA21 and FA22, the electrical connections between the chip input-output pad unit 20 and the die input-output pad units 220 and 320 may be implemented selectively.

Figure 8:
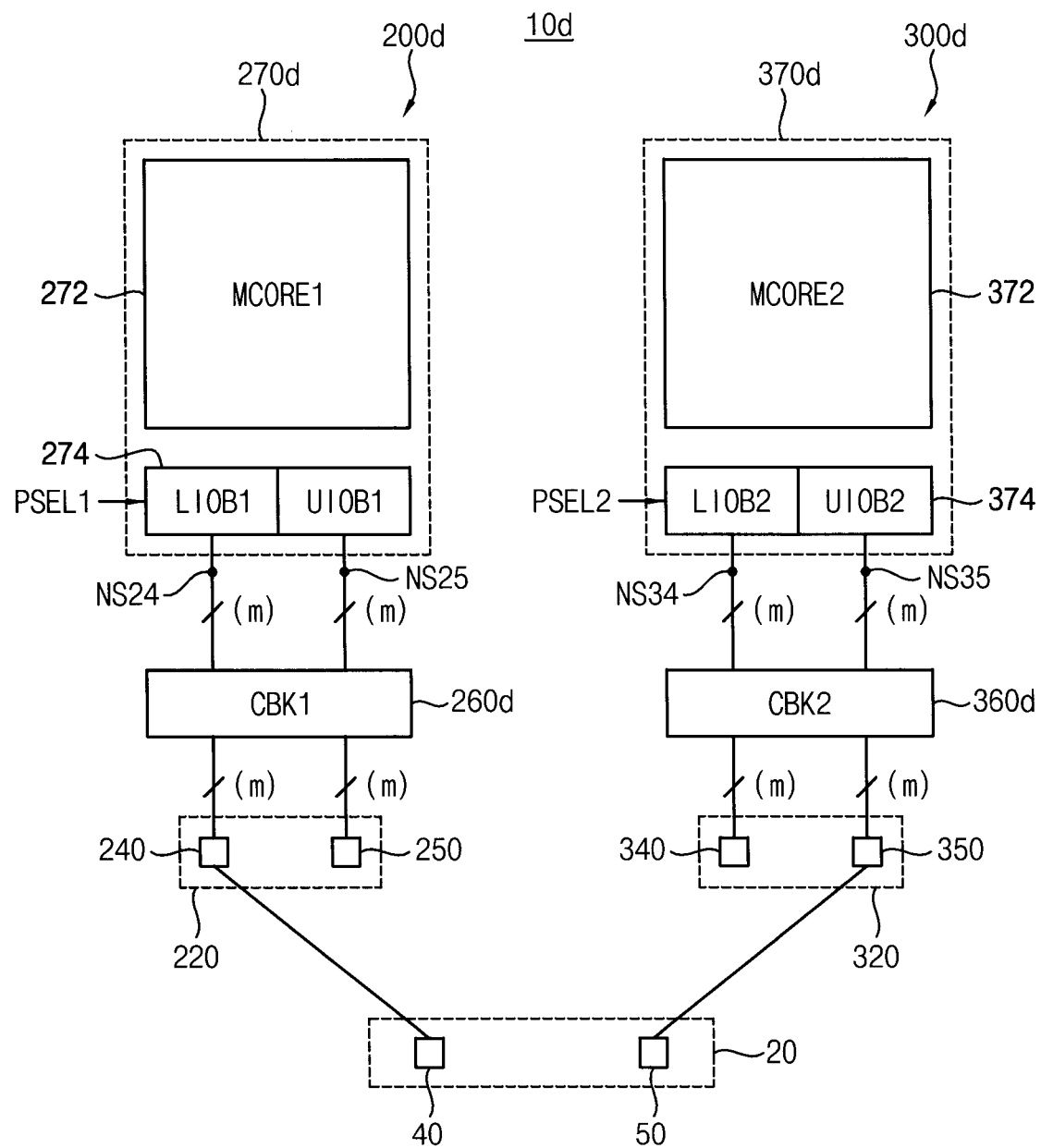
FIG. 8 is a block diagram illustrating a memory chip for describing a path conversion according to example embodiments.

FIG. 8 is a block diagram illustrating a memory chip for describing a path conversion according to example embodiments.

Referring to FIG. 8, a memory chip 10d may include a chip input-output pad unit 20, a first semiconductor die 200d and a second semiconductor die 300d.

The first semiconductor die 200d may include a die input-output pad unit 220, a conversion block CBK1 260d and a memory region 270d. The memory region 270d may include a memory core MCORE1 272 in which a plurality of memory cells are formed and an input-output buffer 274 that buffers the data exchanged between the memory core 272 and the die input-output pad unit 220. The input-output buffer 274 may include a lower input-output buffer LIOB1 corresponding to the lower die data pad unit 240 and an upper input-output buffer UIOB1 corresponding to the upper die data pad unit 250. The conversion block 260d may control an electrical connection between the lower and upper die data pad units 240 and 250 and the input-output buffer 274, that is, the nodes NS24 and NS25.

As will be described below with reference to FIG. 9A, unlike the example embodiment illustrated in FIG. 6, in which the conversion blocks CBK utilized the path selection signals PSEL, in the example embodiment illustrated in FIG. 8, one of the lower input-output buffer LIOB1 and the upper input-output buffer UIOB1 may be enabled selectively in response to a first path selection signal PSEL1.

The second semiconductor die 300d may include a die input-output pad unit 320, a conversion block CBK2 360d and a memory region 370d. The memory region 370d may include a memory core MCORE2 372 in which a plurality of memory cells are formed and an input-output buffer 374 that buffers the data exchanged between the memory core 372 and the die input-output pad unit 320. The input-output buffer 374 may include a lower input-output buffer LIOB2 corresponding to the lower die data pad unit 340 and an upper input-output buffer UIOB2 corresponding to the upper die data pad unit 350. The conversion block 360d may control an electrical connection between the lower and upper die data pad units 340 and 350 and the input-output buffer 374, that is, the nodes NS34 and NS35. As will be described below with reference to FIG. 9B, one of the lower input-output buffer LIOB2 and the upper input-output buffer UIOB2 may be enabled selectively in response to a second path selection signal PSEL2.

As illustrated in FIG. 8, the lower die data pad unit 240 of the first semiconductor die 200d may be electrically connected to the lower chip data pad unit 40 and the upper die data pad unit 250 of the first semiconductor die 200d may be electrically disconnected from the upper chip data pad unit 50. The upper die data pad unit 350 of the second semiconductor die 300d may be electrically connected to the upper chip data pad unit 50 and the lower die data pad unit 340 of the second semiconductor die 300d may be electrically disconnected from the lower chip data pad unit 40. As such, the input-output load may be reduced by selectively connecting each of the stacked semiconductor dies 200d and 300d to one of the lower chip data pad unit 40 and the upper chip data pad unit 50, thereby increasing the operation speed and decreasing the power consumption.

Figure 9A:
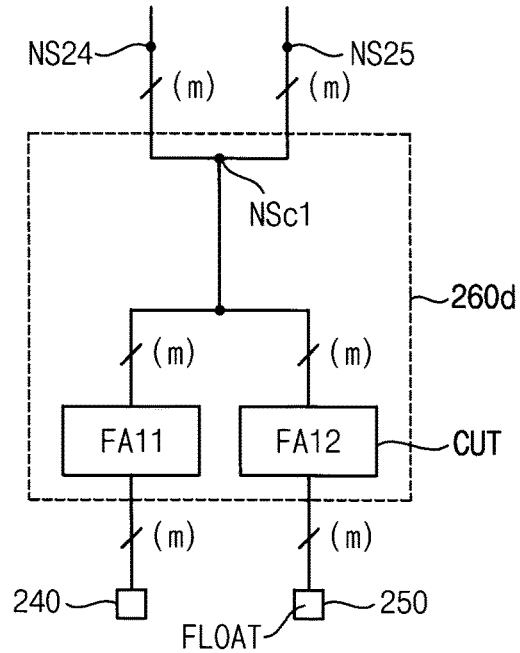
FIGS. 9A and 9B are diagrams illustrating conversion blocks included in semiconductor dies of the memory chip of FIG. 8.
Figure 9B:
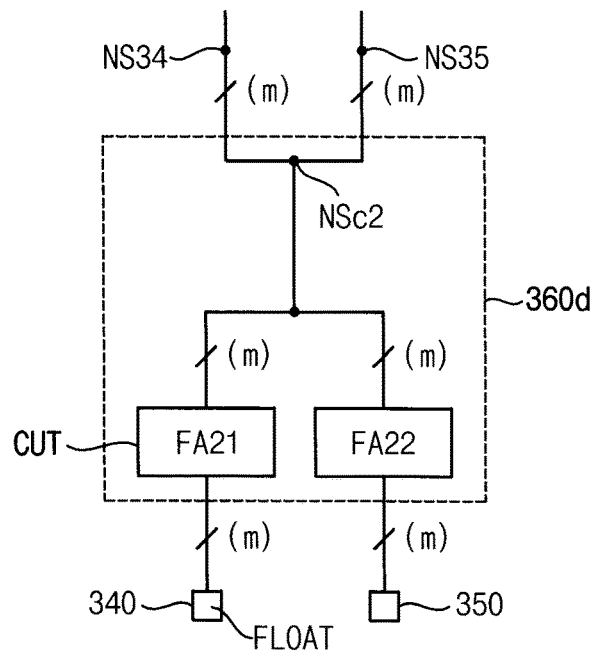

FIGS. 9A and 9B are diagrams illustrating conversion blocks included in semiconductor dies of the memory chip of FIG. 8.

Referring to FIG. 9A, the conversion block 260d of the first semiconductor die 200d may include a first fuse array FA11 and a second fuse array FA12. The lower input-output buffer LIOB1 (i.e., the nodes NS24) and the upper input-output buffer UIOB1 (i.e., the nodes NS25) may be connected to common nodes NSc1. The first fuse array FA11 may be connected between the common nodes NSc1 and the lower die data pad unit 240. The second fuse array FA12 may be connected between the common nodes NSc1 and the upper die data pad unit 250.

Referring to FIG. 9B, the conversion block 360d of the second semiconductor die 300d may include a first fuse array FA21 and a second fuse array FA22. The lower input-output buffer LIOB2 (i.e., the nodes NS34) and the upper input-output buffer UIOB2 (i.e., the nodes NS35) may be connected to common nodes NSc2. The first fuse array FA21 may be connected between the common nodes NSc2 and the lower die data pad unit 340. The second fuse array FA22 may be connected between the common nodes NSc2 and the upper die data pad unit 350.

One of the lower input-output buffer LIOBi (i=1, 2) and the upper input-output buffer UIOBi may be enabled selectively in response to the corresponding path selection signal PSELi. For example, the lower input-output buffer LIOBi may be enabled to be electrically connected to each of the die input-output pad units 220 and 320 when the path selection signal PSELi is in the logic low level and the upper input-output buffer UIOBi may be enabled to be electrically connected to each of the die input-output pad units 220 and 320 when the path selection signal PSELi is in the logic high level. In contrast, the lower input-output buffer LIOBi may be enabled to be electrically connected to each of the die input-output pad units 220 and 320 when the path selection signal PSELi is in the logic high level and the upper input-output buffer UIOBi may be enabled to be electrically connected to each of the die input-output pad units 220 and 320 when the path selection signal PSELi is in the logic low level.

One of the first fuse array and the second fuse array respectively included in the conversion blocks 260*d* and 360*d* may be cut selectively. For example, the second fuse array FA12 may be cut with respect to the conversion block 260*d* of the first semiconductor die 200*d*, but the first fuse array FA21 may be cut with respect to the conversion block 360*d* of the second semiconductor die 300*d*. The upper die data pad unit 250 of the first semiconductor die 200*d* may be floated because the second fuse array FA12 of the first semiconductor die 200*d* is cut and the lower die data pad unit 340 of the second semiconductor die 300*d* may be floated because the first fuse array FA21 of the second semiconductor die 300*d* is cut.

Through selective enable of the input-output buffers LIOB1, UIOB1, LIOB2 and UIOB2 and selective program of the fuse arrays FA11, FA12, FA21 and FA22, the electrical connections between the chip input-output pad unit 30 and the die input-output pad units 220 and 320 may be implemented selectively.

Figure 10:
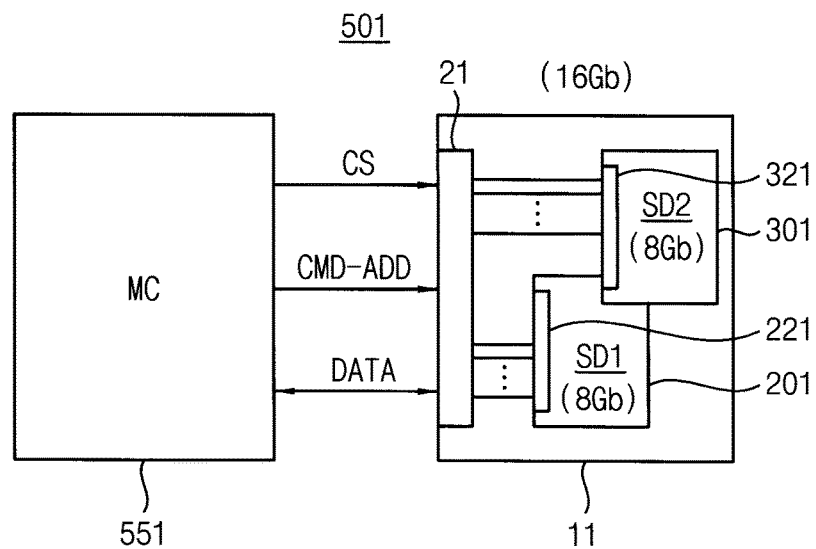
FIG. 10 is a block diagram illustrating a memory system according to example embodiments.

FIG. 10 is a block diagram illustrating a memory system according to example embodiments.

Referring to FIG. 10, a memory system 501 may include a memory controller MC 551 and a stacked memory chip 11.

The stacked memory chip 11 includes a chip input-output pad unit 21 and a plurality of semiconductor dies. While FIG. 10 illustrates first semiconductor die SD1 201 and a second semiconductor die SD2 301 for convenience of illustration, example embodiments are not limited thereto. For example, the stacked memory chip 11 may include three or more semiconductor dies may be packaged in the single memory chip 11.

The first semiconductor die 201 and the second semiconductor die 301 include die input-output pad units 221 and 321 of a same configuration, respectively, and each of the die input-output pad units 221 and 321 may correspond to the chip input-output pad unit 21. As described above, a lower die data pad unit and an upper die data pad unit in each of the die input-output pad units 221 and 321 may be connected selectively to the lower chip data pad unit and the upper chip data pad unit in the chip input-output pad unit 21.

The memory controller 551 may generate a chip selection signal CS, command-address signals CMD-ADD, etc. for controlling the stacked memory chip 11 and the data may be written in or read from the stacked memory chip 11 under control of the memory controller 551.

For example, if each of the semiconductor dies 201 and 301 has a memory capacity of 8 Gb, the memory controller 551 may control the stacked memory chip 11 through an interface scheme corresponding to one semiconductor die of 16 Gb. As will be described below with reference to FIGS. 11 and 12, the memory controller 551 may generate one common chip selection signal CS. The first semiconductor die 201 and the second semiconductor die 301 may receive the common chip selection signal CS and may be selected simultaneously when the common chip selection signal CS is activated. In addition, the memory controller 551 may provide a most significant address bit signal to the stacked memory chip 11 in addition to other address bit signals that are required for accessing the one semiconductor die. The above mentioned path selection signals may be generated based on the common chip selection signal CS and the most significant address bit signal.

FIG. 11 is a cross-sectional diagram illustrating an example embodiment of a memory chip included in the memory system of FIG. 10.

Referring to FIGS. 10 and 11, a memory chip 11 may include a base substrate 101, semiconductor die 201 and a second semiconductor die 301. FIG. 11 illustrates the two semiconductor dies 201 and 301 for convenience of illustration, however, example embodiments may include three or more semiconductor dies packaged in the single memory chip 11.

The base substrate 101 may include a chip input-output pad unit 21 connected to the memory controller 551. The chip input-output pad unit 21 may include a chip command-address pad unit 31 for receiving the common chip selection signal CS and the command-address signal CA, a lower chip data pad unit 41 for communicating lower data signal LDQ and an upper chip data pad unit 51 for communicating higher data signal UDQ. The command-address signal CA, the lower data signal LDQ and the upper data signal UDQ may be multi-bit signals, respectively.

The first semiconductor die 201 and the second semiconductor die 301 may include die input-output pad units 221 and 321 of a same configuration, respectively, and each of the die input-output pad units 221 and 321 may correspond to the chip input-output pad unit 21. The die input-output pad unit 221 of the first semiconductor die 201 may include a die command-address pad unit 231 corresponding to the chip command-address pad unit 31, a lower die data pad unit 241 corresponding to the lower chip data pad unit 41 and an upper die data pad unit 251 corresponding to the upper chip data pad unit 51. The die input-output pad unit 321 of the second semiconductor die 301 may include a die command-address pad unit 331 corresponding to the chip command-address pad unit 31, a lower die data pad unit 341 corresponding to the lower chip data pad unit 41 and an upper die data pad unit 351 corresponding to the upper chip data pad unit 51.

The die command-address pad unit 231 of the first semiconductor die 201 and the die command-address pad unit 331 of the second semiconductor die 301 may be connected commonly to the chip command-address pad unit 31 through the through-silicon vias TSV12, TSV21 and TSV22. FIG. 11 illustrates an example that micro bumps intervene between the base substrate 101 and the semiconductor dies 201 and 301, and the micro bumps may be replaced with an interposer or a wiring tape.

The lower die data pad unit 241 of the first semiconductor die 201 may be electrically connected to the lower chip data pad unit 41 through the bonding wires BW1 and the upper die data pad unit 251 of the first semiconductor die 201 may be electrically disconnected from the upper chip data pad unit 51. The upper die data pad unit 351 of the second semiconductor die 301 may be electrically connected to the upper chip data pad unit 51 through the bonding wires BW2 and the lower die data pad unit 341 of the second semiconductor die 301 may be electrically disconnected from the lower chip data pad unit 41.

As illustrated in FIG. 11, the first semiconductor die 201 and the second semiconductor die 301 may receive the common chip selection signal CS and selected simultaneously when the common chip selection signal CS is activated.

Figure 12A:
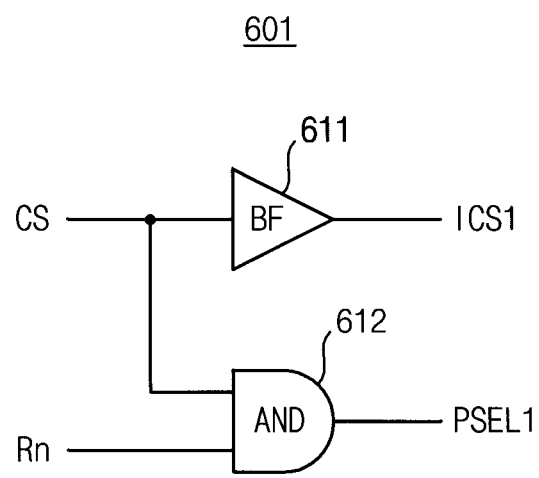
FIGS. 12A, 12B and 12C are diagrams for describing an example path control of the memory chip of FIG. 11.
Figure 12B:
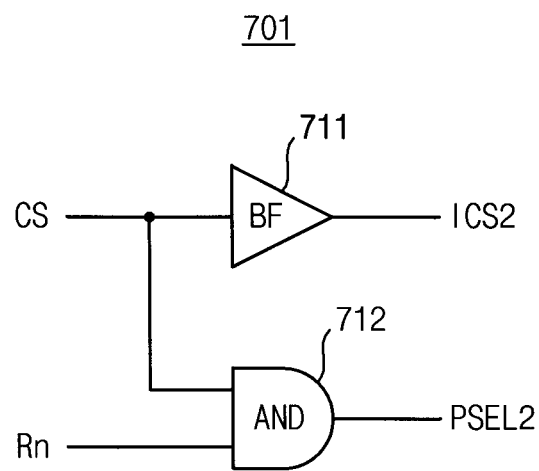
Figures 12C, 13:
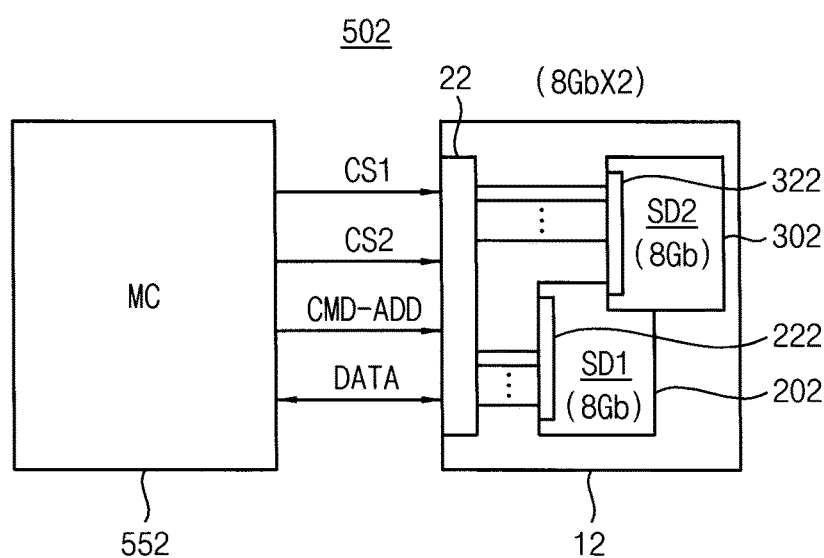
FIG. 13 is a block diagram illustrating a memory system according to example embodiments.

FIGS. 12A, 12B and 12C are diagrams for describing an example path control of the memory chip of FIG. 11.

FIG. 12A illustrates an example of a path controller 601 of the first semiconductor die 201, FIG. 12B illustrates an example of a path controller 701 of the second semiconductor die 301, and FIG. 12C illustrates a truth table representing operations of the path controllers 601 and 701. In some example embodiments, the control logic 410 in the memory region of FIG. 5 in the corresponding semiconductor die may perform the functions of a respective one of the path controllers 601 and 701.

Referring to FIG. 12A, the path controller 601 of the first semiconductor die 201 may include a buffer BF 611 and an AND logic gate 612.

The buffer 611 may buffer the common chip selection signal CS to generate a first internal chip selection signal ICS1. The first internal chip selection signal ICS1 may be provided to the control logic inside the first semiconductor die 201. In other example embodiments, the buffer 611 may be omitted and the common chip selection signal CS as it is may be provided as the first internal chip selection signal ICS1.

The AND logic gate 612 may perform an AND logic operation on the common chip selection signal CS and a most significant address bit signal Rn to generate a first path selection signal PSEL1. The memory controller 551 may provide the most significant address bit signal Rn to the stacked memory chip 11 in addition to other address bit signals that are required for accessing the one semiconductor die. In some example embodiments, the first path selection signal PSEL1 may be provided to the conversion block CBK1 of the first semiconductor die 201 as described with reference to FIG. 6. The conversion block CBK1 may perform the switching operation in response to the first path selection signal PSEL1 to electrically connect one of the lower input-output buffer LIOB1 and the upper input-output buffer UIOB1 selectively to the die input-output pad unit 221. In other example embodiments, the first path selection signal PSEL1 may be provided to the lower and upper input-output buffers LIOB1 and UIOB1 of the first semiconductor die 201 as described with reference to FIG. 8. One of the lower and upper input-output buffers LIOB1 and UIOB1 may be enabled in response to the first path selection signal PSEL1 to electrically connect one of the lower input-output buffer LIOB1 and the upper input-output buffer UIOB1 selectively to the die input-output pad unit 221.

Referring to FIG. 12B, the path controller 701 of the second semiconductor die 301 may include a buffer BF 711 and an AND logic gate 712.

The buffer 711 may buffer the common chip selection signal CS to generate a second internal chip selection signal ICS2. The second internal chip selection signal ICS2 may be provided to the control logic inside the second semiconductor die 301. In other example embodiments, the buffer 711 may be omitted and the common chip selection signal CS as it is may be provided as the second internal chip selection signal ICS2.

The AND logic gate 712 may perform an AND logic operation on the common chip selection signal CS and the most significant address bit signal Rn to generate a second path selection signal PSEL2. The memory controller 551 may provide the most significant address bit signal Rn to the stacked memory chip 11 in addition to other address bit signals that are required for accessing the one semiconductor die. In some example embodiments, the second path selection signal PSEL2 may be provided to the conversion block CBK2 of the second semiconductor die 301 as described with reference to FIG. 6. The conversion block CBK2 may perform the switching operation in response to the second path selection signal PSEL2 to electrically connect one of the lower input-output buffer LIOB2 and the upper input-output buffer UIOB2 selectively to the die input-output pad unit 321. In other example embodiments, the second path selection signal PSEL2 may be provided to the lower and upper input-output buffers LIOB2 and UIOB2 of the second semiconductor die 301 as described with reference to FIG. 8. One of the lower and upper input-output buffers LIOB2 and UIOB2 may be enabled in response to the second path selection signal PSEL2 to electrically connect one of the lower input-output buffer LIOB2 and the upper input-output buffer UIOB2 selectively to the die input-output pad unit 321.

Referring to FIG. 12C, first and second cases CASE1 and CASE2 may correspond to cases that the stacked memory chip 11 is accessed and a third case CASE3 may correspond to a case that the stacked memory chip 11 is not accessed.

When the stacked memory chip 11 is accessed, the common chip selection signal CS may be activated in the logic high level H. The first internal chip selection signal ICS1 and the second internal chip selection signal ICS2 may be activated in the logic high level H regardless of the most significant address bit signal Rn if the common chip selection signal CS is activated, and thus the first semiconductor die 201 and the second semiconductor die 301 may be selected simultaneously. The logic levels of the first path selection signal PSEL1 and the second path selection signal PSEL2 may be determined depending on the logic level of the most significant address bit signal Rn.

When the stacked memory chip 11 is not accessed, the common chip selection signal CS may be deactivated in the logic low level L. The first internal chip selection signal ICS1 and the second internal chip selection signal ICS2 may be deactivated in the logic low level regardless of the most significant address bit signal Rn. Also the first path selection signal PSEL1 and the second path selection signal PSEL2 may be deactivated in the logic low level regardless of the most significant address bit signal Rn.

As such, the first semiconductor die 201 and the second semiconductor die 301 may receive the common chip selection signal CS and may be selected and accessed simultaneously when the common chip selection signal CS is activated. The first and second path selection signals PSEL1 and PSEL2 may be generated based on the common chip selection signal CS and the most significant address bit signal Rn and one of the lower and upper input-output buffers may be connected to the die input-output pad unit based on the first and second path selection signal PSEL1 and PSEL2.

FIGS. 10, 11 and 12 illustrate the example embodiment that the stacked memory chip 11 includes the two semiconductor dies 201 and 301. In this case, the memory controller 551 may control the access to the stacked memory chip 11 through the one chip selection signal and the address bit signals corresponding to the two times (e.g., 16 Gb) of the memory capacity (e.g., 8 Gb) of each semiconductor die. In the same way, when the stacked memory chip includes 2p semiconductor dies, the memory controller may control the access to the stacked memory chip through p chip selection signals corresponding to a half number p of the semiconductor dies and the address bit signals corresponding to the two times (e.g., 16 Gb) of the memory capacity (e.g., 8 Gb) of each semiconductor die.

FIG. 13 is a block diagram illustrating a memory system according to example embodiments.

Referring to FIG. 13, a memory system 502 may include a memory controller MC 552 and a stacked memory chip 12.

The stacked memory chip 12 includes a chip input-output pad unit 22 and a plurality of semiconductor dies. FIG. 13 illustrates an example embodiment including a first semiconductor die SD1 202 and a second semiconductor die SD2 302 for convenience of illustration, however, in other example embodiments three or more semiconductor dies may be packaged in the single memory chip 12. The first semiconductor die 202 and the second semiconductor die 302 include die input-output pad units 222 and of a same configuration, respectively, and each of the die input-output pad units 222 and 322 may correspond to the chip input-output pad unit 22. As described above, the lower die data pad unit and the upper die data pad unit in the die input-output pad units 222 and 322 may be connected selectively to the lower chip data pad unit and the upper chip data pad unit in the chip input-output pad unit 22.

The memory controller 552 may generate chip selection signals CS1 and CS2, command-address signals CMD-ADD, etc. for controlling the stacked memory chip 12 and the data may be written in or read from the stacked memory chip 12 under control of the memory controller 552.

For example, if each of the semiconductor dies 202 and 302 has a memory capacity of 8 Gb, the memory controller 552 may control the stacked memory chip 12 through an interface scheme corresponding to two semiconductor dies of 8 Gb. As will be described below with reference to FIGS. 14 through 17, the memory controller 552 may generate a first chip selection signal CS1 and a second chip selection signal CS2. The first semiconductor die 202 and the second semiconductor die 302 may receive the first and second chip selection signals CS1 and CS2 and may be selected simultaneously when one of the first and second chip selection signals CS1 and CS2 is activated. The above mentioned path selection signals may be generated based on the first and second chip selection signals CS1 and CS2.

Figure 14:
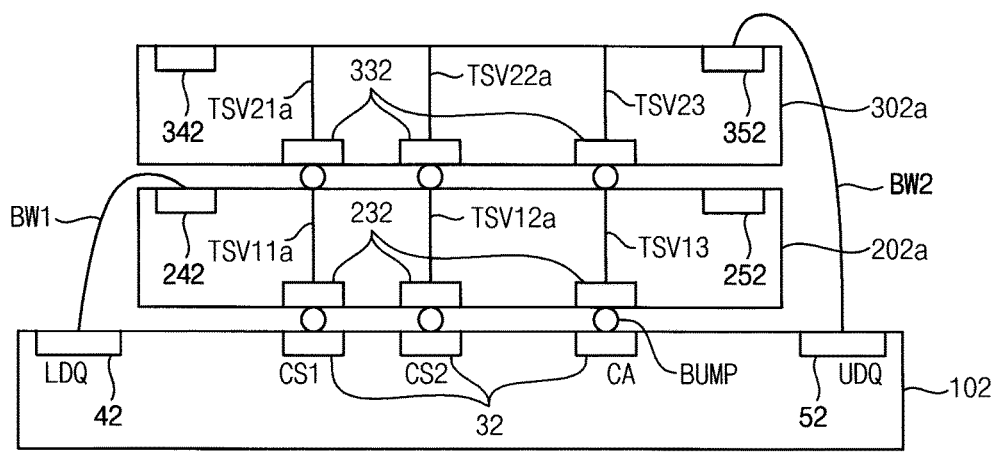
FIG. 14 is a cross-sectional diagram illustrating an example embodiment of a memory chip included in the memory system of FIG. 13.

FIG. 14 is a cross-sectional diagram illustrating an example embodiment of a memory chip included in the memory system of FIG. 13.

Referring to FIGS. 13 and 14, a memory chip 12a may include abase substrate 102, a first semiconductor die 202a and a second semiconductor die 302a. FIG. 14 illustrates the two semiconductor dies 202a and 302a for convenience of illustration and three or more semiconductor dies may be packaged in the single memory chip 12a.

The base substrate 102 may include a chip input-output pad unit 22 connected to the memory controller 552. The chip input-output pad unit 22 may include a chip command-address pad unit 32 for receiving the first and second chip selection signals CS1 and CS2 and the command-address signal CA, a lower chip data pad unit 42 for communicating lower data signal LDQ and an upper chip data pad unit 52 for communicating higher data signal UDQ. The command-address signal CA, the lower data signal LDQ and the upper data signal UDQ may be multi-bit signals, respectively.

The first semiconductor die 202a and the second semiconductor die 302a may include die input-output pad units 222 and 322 of a same configuration, respectively, and each of the die input-output pad units 222 and 322 may correspond to the chip input-output pad unit 22. The die input-output pad unit 222 of the first semiconductor die 202a may include a die command-address pad unit 232 corresponding to the chip command-address pad unit 32, a lower die data pad unit 242 corresponding to the lower chip data pad unit 42 and an upper die data pad unit corresponding to the upper chip data pad unit 52. The die input-output pad unit 322 of the second semiconductor die 302a may include a die command-address pad unit 332 corresponding to the chip command-address pad unit 32, a lower die data pad unit 342 corresponding to the lower chip data pad unit 42 and an upper die data pad unit 352 corresponding to the upper chip data pad unit 52.

The die command-address pad unit 232 of the first semiconductor die 202a and the die command-address pad unit 332 of the second semiconductor die 302a may be connected commonly to the chip command-address pad unit 32 through the through-silicon vias TSV11a, TSV12a, TSV13a, TSV21a, TSV22a and TSV23a. FIG. 14 illustrates an example that micro bumps intervene between the base substrate 102 and the semiconductor dies 202a and 302a, and the micro bumps may be replaced with an interposer or a wiring tape.

The lower die data pad unit 242 of the first semiconductor die 202a may be electrically connected to the lower chip data pad unit 42 through the bonding wires BW1 and the upper die data pad unit 252 of the first semiconductor die 202a may be electrically disconnected from the upper chip data pad unit 52. The upper die data pad unit 352 of the second semiconductor die 302a may be electrically connected to the upper chip data pad unit 52 through the bonding wires BW2 and the lower die data pad unit 342 of the second semiconductor die 302a may be electrically disconnected from the lower chip data pad unit 42.

As illustrated in FIG. 14, the first semiconductor die 202a and the second semiconductor die 302a may receive the first and second chip selection signals CS1 and CS2 and may be selected simultaneously when one of the first and second chip selection signals CS1 and CS2 is activated. The first and second chip selection signals CS1 and CS2 may be transferred to the vertically-adjacent semiconductor die through the through-silicon vias of the same position. In other words, the first chip selection signal CS1 may be transferred from the first semiconductor die 202a to the second semiconductor die 302a through the through-silicon vias TSV11a and TSV21a of the same position, and the second chip selection signal CS2 may be transferred from the first semiconductor die 202a to the second semiconductor die 302a through the through-silicon vias TSV12a and TSV22a of the same position.

Figure 15A:
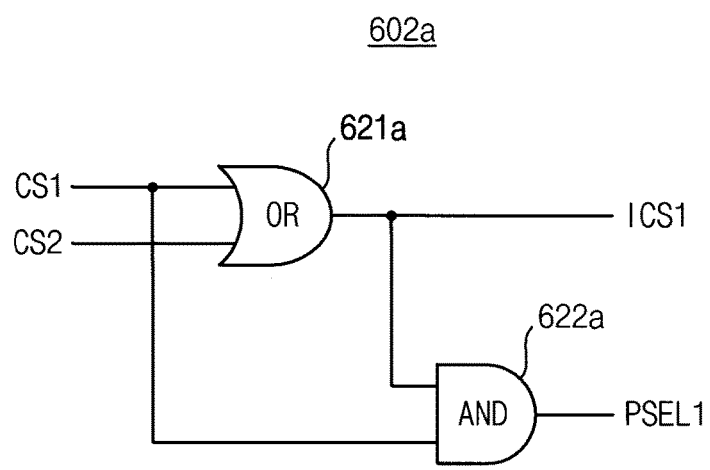
FIGS. 15A, 15B and 15C are diagrams for describing an example path control of the memory chip of FIG. 14.
Figure 15B:
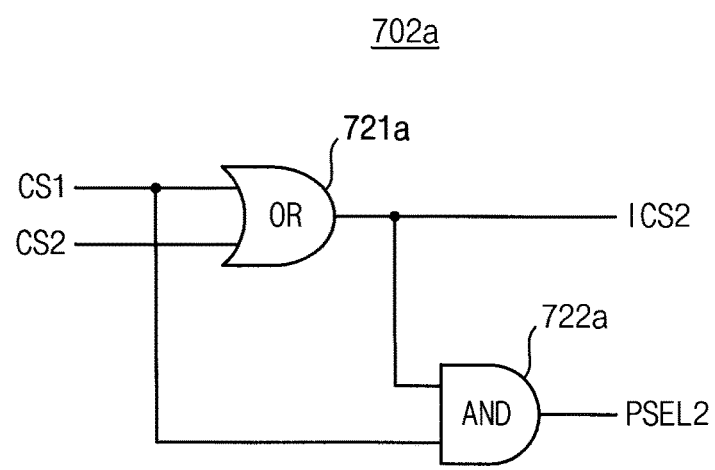
Figures 15C, 16:
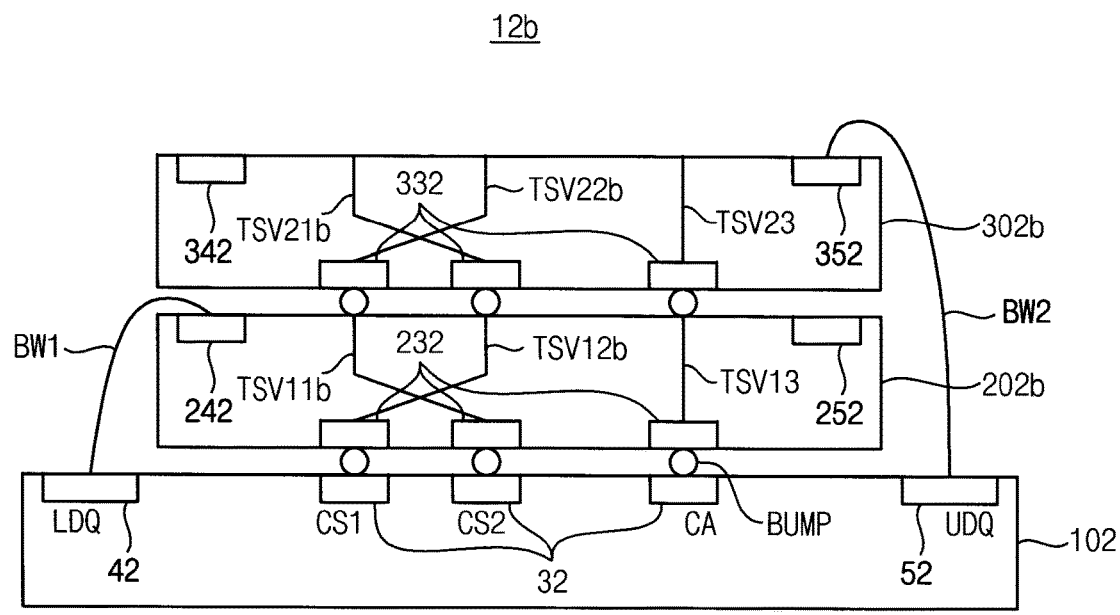
FIG. 16 is a cross-sectional diagram illustrating an example embodiment of a memory chip included in the memory system of FIG. 13.

FIGS. 15A, 15B and 15C, are diagrams for describing an example path control of the memory chip of FIG. 14.

FIG. 15A illustrates an example of a path controller 602a of the first semiconductor die 202a, FIG. 15B illustrates an example of a path controller 702a of the second semiconductor die 302a, and FIG. 15C illustrates a truth table representing operations of the path controllers 602a and 702a. For example, each of the path controllers 602a and 702a may be included in the control logic 410 in the memory region of FIG. 5 in the corresponding semiconductor die.

Referring to FIG. 15A, the path controller 602a of the first semiconductor die 202a may include an OR logic gate 621a and an AND logic gate 622a.

The OR logic gate 621a may perform an OR logic operation on the first chip selection signal CS1 and the second chip selection signal CS2 to generate a first internal chip selection signal ICS1. The first internal chip selection signal ICS1 may be provided to the control logic inside the first semiconductor die 202a.

The AND logic gate 622a may perform an AND logic operation on the first chip selection signal CS1 and the first internal chip selection signal ICS1 to generate a first path selection signal PSEL1. In some example embodiments, the first path selection signal PSEL1 may be provided to the conversion block CBK1 of the first semiconductor die 202a as described with reference to FIG. 6. The conversion block CBK1 may perform the switching operation in response to the first path selection signal PSEL1 to electrically connect one of the lower input-output buffer LIOB1 and the upper input-output buffer UIOB1 selectively to the die input-output pad unit 222. In other example embodiments, the first path selection signal PSEL1 may be provided to the lower and upper input-output buffers LIOB1 and UIOB1 of the first semiconductor die 202a as described with reference to FIG. 8. One of the lower and upper input-output buffers LIOB1 and UIOB1 may be enabled in response to the first path selection signal PSEL1 to electrically connect one of the lower input-output buffer LIOB1 and the upper input-output buffer UIOB1 selectively to the die input-output pad unit 222.

Referring to FIG. 15B, the path controller 702a of the second semiconductor die 302a may include an OR logic gate 721a and an AND logic gate 722a.

The OR logic gate 721a may perform an OR logic operation on the first chip selection signal CS1 and the second chip selection signal CS2 to generate a second internal chip selection signal ICS2. The second internal chip selection signal ICS2 may be provided to the control logic inside the second semiconductor die 302a.

The AND logic gate 722a may perform an AND logic operation on the first chip selection signal CS1 and the second internal chip selection signal ICS2 to generate a second path selection signal PSEL2. In some example embodiments, the second path selection signal PSEL2 may be provided to the conversion block CBK2 of the second semiconductor die 302a as described with reference to FIG. 6. The conversion block CBK2 may perform the switching operation in response to the second path selection signal PSEL2 to electrically connect one of the lower input-output buffer LIOB2 and the upper input-output buffer UIOB2 selectively to the die input-output pad unit 322. In other example embodiments, the second path selection signal PSEL2 may be provided to the lower and upper input-output buffers LIOB2 and UIOB2 of the second semiconductor die 302a as described with reference to FIG. 8. One of the lower and upper input-output buffers LIOB2 and UIOB2 may be enabled in response to the second path selection signal PSEL2 to electrically connect one of the lower input-output buffer LIOB2 and the upper input-output buffer UIOB2 selectively to the die input-output pad unit 322.

Referring to FIG. 15C, first and second cases CASE1 and CASE2 may correspond to cases that the stacked memory chip 12a is accessed and a third case CASE3 may correspond to a case that the stacked memory chip 12a is not accessed.

When the stacked memory chip 12a is accessed, one of the first and second chip selection signals CS1 and CS2 may be activated in the logic high level H. The first internal chip selection signal ICS1 and the second internal chip selection signal ICS2 may be activated in the logic high level H if one of the first and second chip selection signals CS1 and CS2 is activated, and thus the first semiconductor die 202a and the second semiconductor die 302a may be selected simultaneously. The logic levels of the first path selection signal PSEL1 and the second path selection signal PSEL2 may be determined depending on the logic level of the first chip selection signal CS1.

When the stacked memory chip 12a is not accessed, both of the first and second chip selection signals CS1 and CS2 may be deactivated in the logic low level L. The first internal chip selection signal ICS1 and the second internal chip selection signal ICS2 may be deactivated in the logic low level and also the first path selection signal PSEL1 and the second path selection signal PSEL2 may be deactivated in the logic low level.

As such, the first semiconductor die 202a and the second semiconductor die 302a may receive the first and second chip selection signals CS1 and CS2 and may be selected and accessed simultaneously when one of the first and second chip selection signals CS1 and CS2 is activated. The first and second path selection signals PSEL1 and PSEL2 may be generated based on the first and second chip selection signals CS1 and CS2 and one of the lower and upper input-output buffers may be connected to the die input-output pad unit based on the first and second path selection signal PSEL1 and PSEL2.

FIGS. 13 through 15 illustrate the example embodiment that the stacked memory chip 12a includes the two semiconductor dies 202a and 302a. In this case, the memory controller 552 may control the access to the stacked memory chip 12a through the two chip selection signals and the address bit signals corresponding to the memory capacity e.g., 8 Gb) of each semiconductor die. In the same way, when the stacked memory chip includes 2p semiconductor dies, the memory controller may control the access to the stacked memory chip through 2p chip selection signals corresponding to a number 2p of the semiconductor dies and the address bit signals corresponding to the memory capacity (e.g., 8 Gb) of each semiconductor die.

FIG. 16 is a cross-sectional diagram illustrating an example embodiment of a memory chip included in the memory system of FIG. 13.

Referring to FIGS. 13 and 16, a memory chip 12b may include abuse substrate 102, a first semiconductor die 202b and a second semiconductor die 302b. FIG. 16 illustrates the two semiconductor dies 202b and 302b for convenience of illustration and three or more semiconductor dies may be packaged in the single memory chip 12b.

The base substrate 102 may include a chip input-output pad unit 22 connected to the memory controller 552. The chip input-output pad unit 22 may include a chip command-address pad unit 32 for receiving the first and second chip selection signals CS1 and CS2 and the command-address signal CA, a lower chip data pad unit 42 for communicating lower data signal LDQ and an upper chip data pad unit 52 for communicating higher data signal UDQ. The command-address signal CA, the lower data signal LDQ and the upper data signal UDQ may be multi-bit signals, respectively.

The first semiconductor die 202b and the second semiconductor die 302b may include die input-output pad units 222 and 322 of a same configuration, respectively, and each of the die input-output pad units 222 and 322 may correspond to the chip input-output pad unit 22. The die input-output pad unit 222 of the first semiconductor die 202b may include a die command-address pad unit 232 corresponding to the chip command-address pad unit 32, a lower die data pad unit 242 corresponding to the lower chip data pad unit 42 and an upper die data pad unit 252 corresponding to the upper chip data pad unit 52. The die input-output pad unit 322 of the second semiconductor die 302b may include a die command-address pad unit 332 corresponding to the chip command-address pad unit 32, a lower die data pad unit 342 corresponding to the lower chip data pad unit 42 and an upper die data pad unit 352 corresponding to the upper chip data pad unit 52.

The die command-address pad unit 232 of the first semiconductor die 202b and the die command-address pad unit 332 of the second semiconductor die 302b may be connected commonly to the chip command-address pad unit 32 through the through-silicon vias TSV11b, TSV12b, TSV13b, TSV21b, TSV22b and TSV23b. FIG. 16 illustrates an example that micro bumps intervene between the base substrate 102 and the semiconductor dies 202b and 302b, and the micro bumps may be replaced with an interposer or a wiring tape.

The lower die data pad unit 242 of the first semiconductor die 202b may be electrically connected to the lower chip data pad unit 42 through the bonding wires BW1 and the upper die data pad unit 252 of the first semiconductor die 202b may be electrically disconnected from the upper chip data pad unit 52. The upper die data pad unit 352 of the second semiconductor die 302b may be electrically connected to the upper chip data pad unit 52 through the bonding wires BW2 and the lower die data pad unit 342 of the second semiconductor die 302b may be electrically disconnected from the lower chip data pad unit 42.

As illustrated in FIG. 16, the first semiconductor die 202b and the second semiconductor die 302b may receive the first and second chip selection signals CS1 and CS2 and may be selected simultaneously when one of the first and second chip selection signals CS1 and CS2 is activated. The first and second chip selection signals CS1 and CS2 may be transferred to the vertically-adjacent semiconductor die through the through-silicon vias of the zigzag position. In other words, the first chip selection signal CS1 may be transferred from the first semiconductor die 202b to the second semiconductor die 302b through the through-silicon vias TSV12b and TSV21b of the zigzag position, and the second chip selection signal CS2 may be transferred from the first semiconductor die 202b to the second semiconductor die 302b through the through-silicon vias TSV11b and TSV22b of the zigzag position.

Figure 17A:
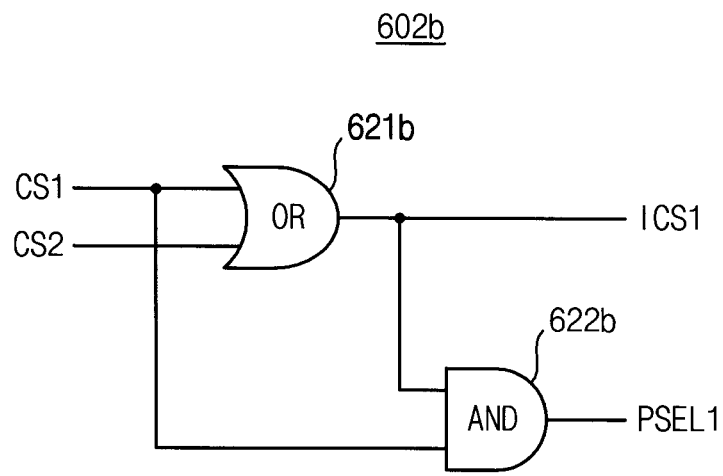
Figure 17B:
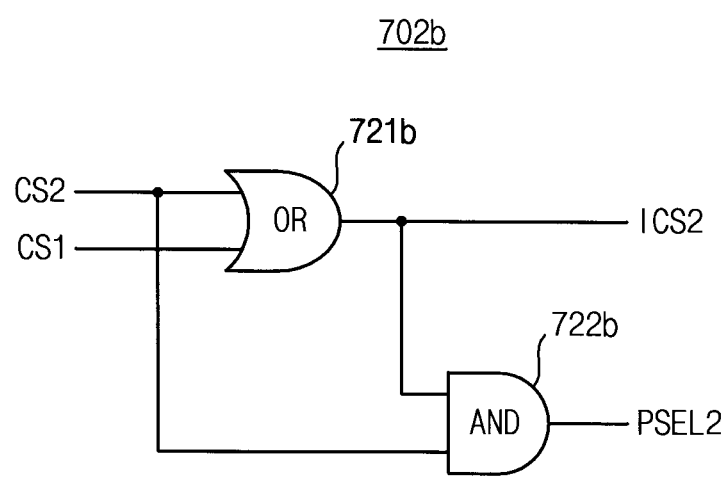

FIGS. 17A, 17B and 17C are diagrams for describing an example path control of the memory chip of FIG. 16.

FIG. 17A illustrates an example of a path controller 602b of the first semiconductor die 202b, FIG. 17B illustrates an example of a path controller 702b of the second semiconductor die 302b, and FIG. 17C illustrates a truth table representing operations of the path controllers 602b and 702b. For example, each of the path controllers 602b and 702b may be included in the control logic 410 in the memory region of FIG. 5 in the corresponding semiconductor die.

Referring to FIG. 17A, the path controller 602b of the first semiconductor die 202b may include an OR logic gate 621b and an AND logic gate 622b.

The OR logic gate 621b may perform an OR logic operation on the first chip selection signal CS1 and the second chip selection signal CS2 to generate a first internal chip selection signal ICS1. The first internal chip selection signal ICS1 may be provided to the control logic inside the first semiconductor die 202b.

The AND logic gate 622b may perform an AND logic operation on the first chip selection signal CS1 and the first internal chip selection signal ICS1 to generate a first path selection signal PSEL1. In some example embodiments, the first path selection signal PSEL1 may be provided to the conversion block CBK1 of the first semiconductor die 202b as described with reference to FIG. 6. The conversion block CBK1 may perform the switching operation in response to the first path selection signal PSEL1 to electrically connect one of the lower input-output buffer LIOB1 and the upper input-output buffer UIOB1 selectively to the die input-output pad unit 222. In other example embodiments, the first path selection signal PSEL1 may be provided to the lower and upper input-output buffers LIOB1 and UIOB1 of the first semiconductor die 202b as described with reference to FIG. 8. One of the lower and upper input-output buffers LIOB1 and UIOB1 may be enabled in response to the first path selection signal PSEL1 to electrically connect one of the lower input-output buffer LIOB1 and the upper input-output buffer UIOB1 selectively to the die input-output pad unit 222.

Referring to FIG. 17B, the path controller 702b of the second semiconductor die 302b may include an OR logic gate 721b and an AND logic gate 722b.

The OR logic gate 721b may perform an OR logic operation on the first chip selection signal CS1 and the second chip selection signal CS2 to generate a second internal chip selection signal ICS2. The second internal chip selection signal ICS2 may be provided to the control logic inside the second semiconductor die 302b.

The AND logic gate 722b may perform an AND logic operation on the second chip selection signal CS2 and the second internal chip selection signal ICS2 to generate a second path selection signal PSEL2. In some example embodiments, the second path selection signal PSEL2 may be provided to the conversion block CBK2 of the second semiconductor die 302b as described with reference to FIG. 6. The conversion block CBK2 may perform the switching operation in response to the second path selection signal PSEL2 to electrically connect one of the lower input-output buffer LIOB2 and the upper input-output buffer UIOB2 selectively to the die input-output pad unit 322. In other example embodiments, the second path selection signal PSEL2 may be provided to the lower and upper input-output buffers LIOB2 and UIOB2 of the second semiconductor die 302b as described with reference to FIG. 8. One of the lower and upper input-output buffers LIOB2 and UIOB2 may be enabled in response to the second path selection signal PSEL2 to electrically connect one of the lower input-output buffer LIOB2 and the upper input-output buffer UIOB2 selectively to the die input-output pad unit 322.

Referring to FIG. 17C, first and second cases CASE1 and CASE2 may correspond to cases that the stacked memory chip 12b is accessed and a third case CASE3 may correspond to a case that the stacked memory chip 12b is not accessed.

When the stacked memory chip 12b is accessed, one of the first and second chip selection signals CS1 and CS2 may be activated in the logic high level H. The first internal chip selection signal ICS1 and the second internal chip selection signal ICS2 may be activated in the logic high level H if one of the first and second chip selection signals CS1 and CS2 is activated, and thus the first semiconductor die 202b and the second semiconductor die 302b may be selected simultaneously. The logic level of the first path selection signal PSEL1 may be determined depending on the logic level of the first chip selection signal CS1, and the logic level of the second path selection signal PSEL2 may be determined depending on the logic level of the second chip selection signal CS2.

When the stacked memory chip 12b is not accessed, both of the first and second chip selection signals CS1 and CS2 may be deactivated in the logic low level L. The first internal chip selection signal ICS1 and the second internal chip selection signal ICS2 may be deactivated in the logic low level and also the first path selection signal PSEL1 and the second path selection signal PSEL2 may be deactivated in the logic low level.

As such, the first semiconductor die 202b and the second semiconductor die 302b may receive the first and second chip selection signals CS1 and CS2 and may be selected and accessed simultaneously when one of the first and second chip selection signals CS1 and CS2 is activated. The first and second path selection signals PSEL1 and PSEL2 may be generated based on the first and second chip selection signals CS1 and CS2 and one of the lower and upper input-output buffers may be connected to the die input-output pad unit based on the first and second path selection signal PSEL1 and PSEL2.

Figure 18:
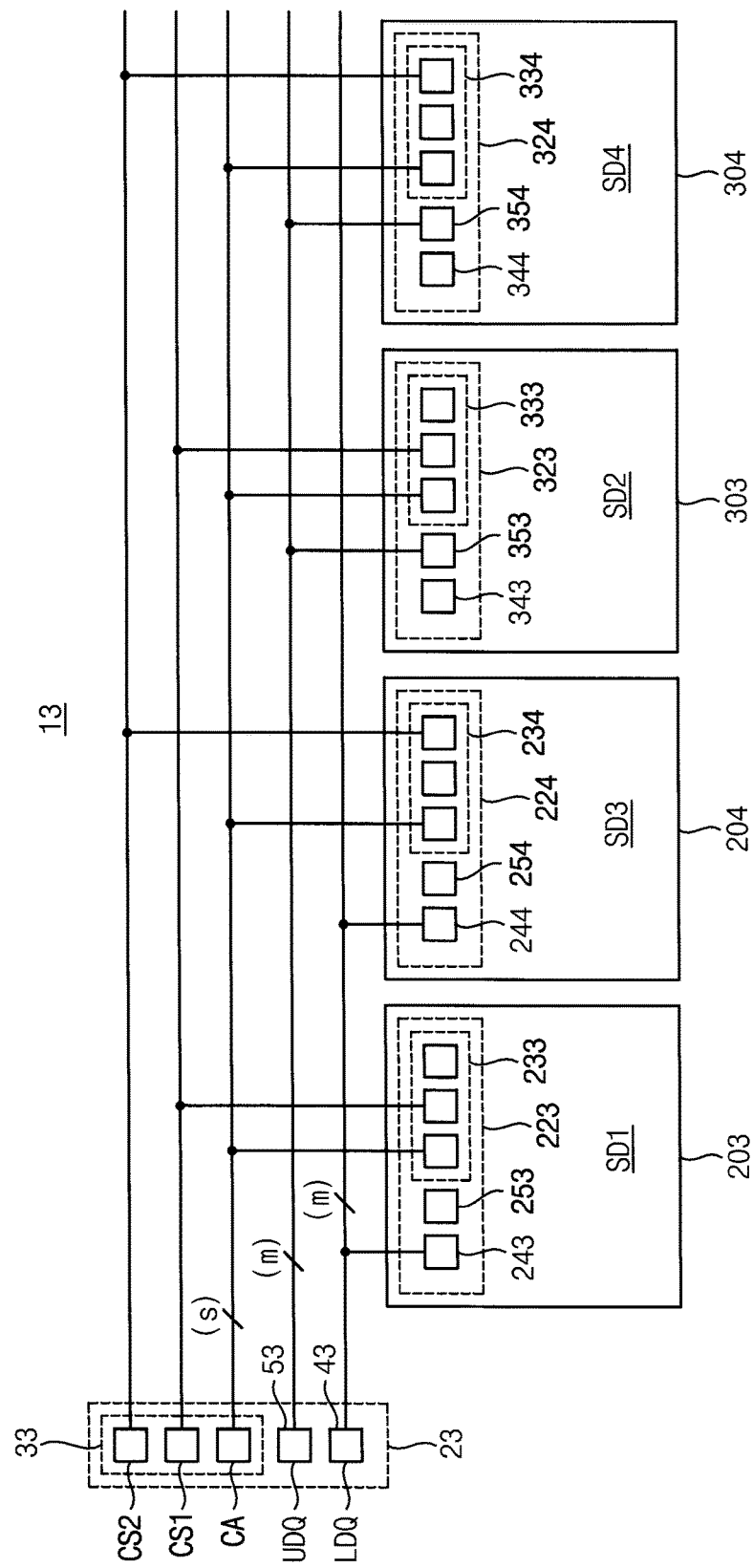
FIG. 18 is a circuit diagram illustrating a stacked memory chip according to example embodiments.

FIG. 18 is a circuit diagram illustrating a stacked memory chip according to example embodiments.

Referring to FIG. 18, a stacked memory chip 13 includes a chip input-output pad unit 23, a first semiconductor die SD1 203, a second semiconductor die SD2 303, a third semiconductor die SD3 204 and a fourth semiconductor die SD4 304.

The chip input-output pad unit 23 includes a chip command-address pad unit 33, a lower chip data pad unit 43 and an upper chip data pad unit 53 that are to be connected to an external device. For example, the chip command-address pad unit 33 may include s+2 pads for receiving a first common chip selection signal CS1, a second common chip selection signal CS2 and command-address signals CA. The lower chip data pad unit 43 may include m pads for communicating lower data LDQ of m bits and the upper chip data pad unit 53 may include m pads for communicating upper data UDQ of m bits.

The first through fourth semiconductor dies 203, 303, 204 and 304 may include die input-output pad units 223, 323, 224 and 324 of a same configuration, respectively, and each of the die input-output pad units 223, 323, 224 and 324 may correspond to the chip input-output pad unit 23 such that each of the die input-output pad units 223, 323, 224 and 324 may include the same number of pads for communicating the same signals as the chip input-output pad unit 23.

The die input-output pad unit 223 of the first semiconductor die 203 includes a die command-address pad unit 233 corresponding to the chip command-address pad unit 33, a lower die data pad unit 243 corresponding to the lower chip data pad unit 43 and an upper die data pad unit 253 corresponding to the upper chip data pad unit 53. The die input-output pad unit 323 of the second semiconductor die 303 includes a die command-address pad unit 333 corresponding to the chip command-address pad unit 33, a lower die data pad unit 343 corresponding to the lower chip data pad unit 43 and an upper die data pad unit 353 corresponding to the upper chip data pad unit 53.

The die input-output pad unit 224 of the third semiconductor die 204 includes a die command-address pad unit 234 corresponding to the chip command-address pad unit 33, a lower die data pad unit 244 corresponding to the lower chip data pad unit 43 and an upper die data pad unit 254 corresponding to the upper chip data pad unit 53. The die input-output pad unit 324 of the fourth semiconductor die 304 includes a die command-address pad unit 334 corresponding to the chip command-address pad unit 33, a lower die data pad unit 344 corresponding to the lower chip data pad unit 43 and an upper die data pad unit 354 corresponding to the upper chip data pad unit 53.

The die command-address pad units 233, 333, 234 and 334 of the first through fourth semiconductor dies 203, 303, 204 and 304 may be connected commonly to the chip command-address pad unit 33. The lower die data pad units 243 and 244 of the first and third semiconductor dies 203 and 204 may be electrically connected to the lower hip data pad unit 43 and the upper die data pad units 253 and 254 of the first and third semiconductor dies 203 and 204 may be electrically disconnected from the upper chip data pad unit 53. The upper die data pad units 353 and 354 of the second and fourth semiconductor dies 303 and 304 may be electrically connected to the upper chip data pad unit 53 and the lower data pad units 343 and 344 of the second and fourth semiconductor dies 303 and 304 may be electrically disconnected from the lower chip data pad unit 43.

The first semiconductor die 203 and the second semiconductor die 303 may receive the first common chip selection signal CS1 and may be selected and accessed simultaneously when the first common chip selection signal CS1 is activated. The third semiconductor die 204 and the fourth semiconductor die 304 may receive the second common chip selection signal CS2 and may be selected and accessed simultaneously when the second common chip selection signal CS2 is activated.

As such, the input-output load may be reduced by selectively connecting each of the stacked semiconductor dies 203, 303, 204 and 304 to one of the lower chip data pad unit 43 and the upper chip data pad unit 53, thereby increasing the operation speed and decreasing the power consumption. Through such reduction of the input-output load, the number of the stacked semiconductor dies may be further increased and the memory device of a higher memory capacity may be implemented efficiently.

Figure 19A:
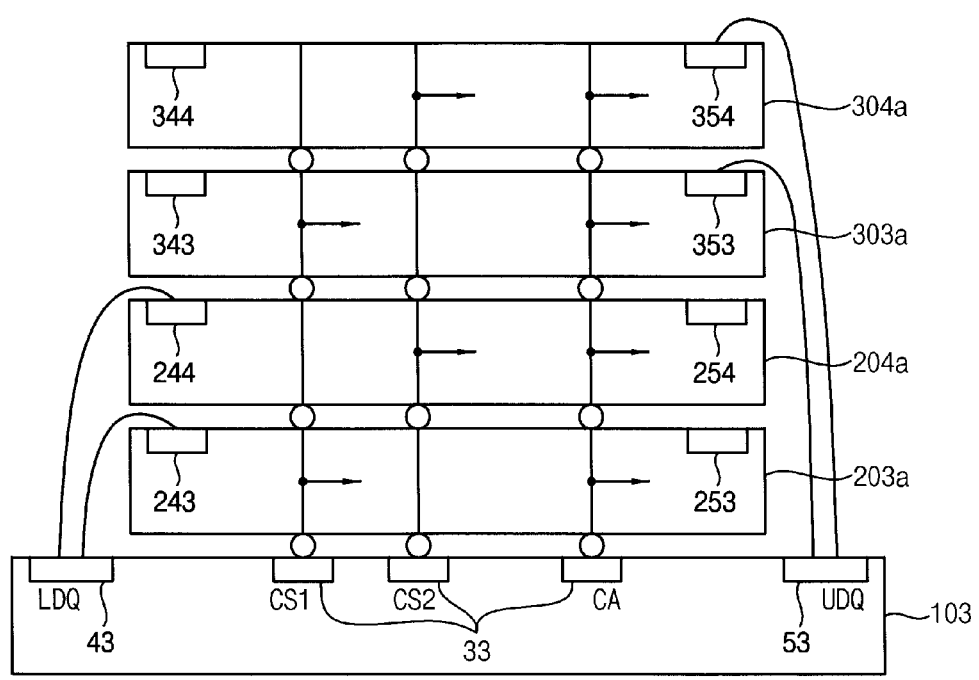
FIGS. 19A and 19B are cross-sectional diagrams illustrating example embodiments of the memory chip of FIG. 18.
Figure 19B:
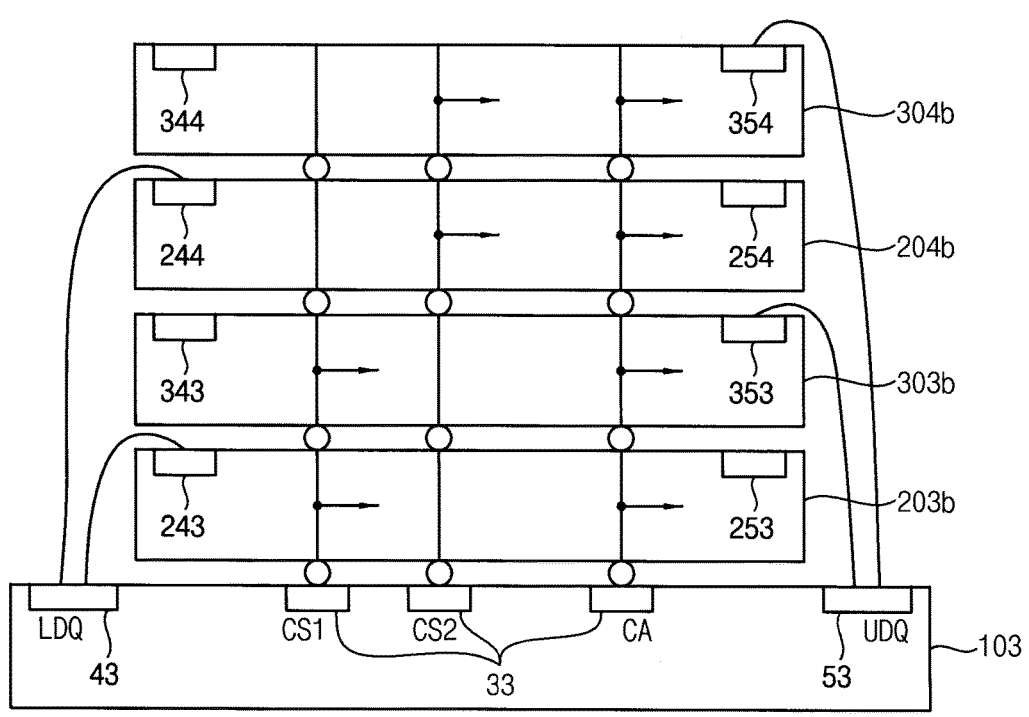

FIGS. 19A and 19B are cross-sectional diagrams illustrating example embodiments of the memory chip of FIG. 18.

In FIGS. 19A and 19B, horizontal arrows represent that the corresponding through-silicon via is electrically connected to the internal circuit of the semiconductor die. The selective electrical connection between the through-silicon via may be implemented through selective cutting of electrical fuse formed between the through-silicon vias and the internal circuit, switching operation of switch circuits formed between the through-silicon vias and the internal circuit, etc.

Referring to FIG. 19A, a memory chip 13a may include a base substrate 103, a first semiconductor die 203a, a second semiconductor die 303a, a third semiconductor die 204a and a fourth semiconductor die 304a. The third semiconductor die 204a may be stacked directly on the first semiconductor die 203a, and the fourth semiconductor die 304a may be stacked directly on the second semiconductor die 303a. The through-silicon vias for transferring the first common chip selection signal CS1 may be electrically connected to the internal circuits of the first and second semiconductor dies 203a and 303a. The through-silicon vias for transferring the second common chip selection signal CS2 may be electrically connected to the internal circuits of the third and fourth semiconductor dies 204a and 304a. The through-silicon vias for transferring the command-address signals CA may be electrically connected to the internal circuits of the first through fourth semiconductor dies 203a, 303a, 204a and 304a.

The lower die data pad units 243 and 244 of the first and third semiconductor dies 203a and 204a may be electrically connected to the lower chip data pad unit 43 and the upper die data pad unit 253 and 254 of the first and third semiconductor dies 203a and 204a may be electrically disconnected from the upper chip data pad unit 53. The upper die data pad units 353 and 354 of the second and fourth semiconductor dies 303a and 304a may be electrically connected to the upper chip data pad unit 53 and the lower die data pad unit 343 and 344 of the second and fourth semiconductor dies 303a and 304a may be electrically disconnected from the lower chip data pad unit 43.

Referring to FIG. 19B, a memory chip 13b may include a base substrate 103, a first semiconductor die 203b, a second semiconductor die 303b, a third semiconductor die 204b and a fourth semiconductor die 304b. The second semiconductor die 303b may be stacked directly on the first semiconductor die 203b, and the fourth semiconductor die 304b may be stacked directly on the third semiconductor die 204b. The through-silicon vias for transferring the first common chip selection signal CS1 may be electrically connected to the internal circuits of the first and second semiconductor dies 203b and 303b. The through-silicon vias for transferring the second common chip selection signal CS2 may be electrically connected to the internal circuits of the third and fourth semiconductor dies 204b and 304b. The through-silicon vias for transferring the command-address signals CA may be electrically connected to the internal circuits of the first through fourth semiconductor dies 203b, 303b, 204b and 304b.

The lower die data pad units 243 and 244 of the first and third semiconductor dies 203a and 204a may be electrically connected to the lower chip data pad unit 43 and the upper die data pad unit 253 and 254 of the first and third semiconductor dies 203a and 204a may be electrically disconnected from the upper chip data pad unit 53. The upper die data pad units 353 and 354 of the second and fourth semiconductor dies 303a and 304a may be electrically connected to the upper chip data pad unit 53 and the lower die data pad unit 343 and 344 of the second and fourth semiconductor dies 303a and 304a may be electrically disconnected from the lower chip data pad unit 43.

Figure 20:
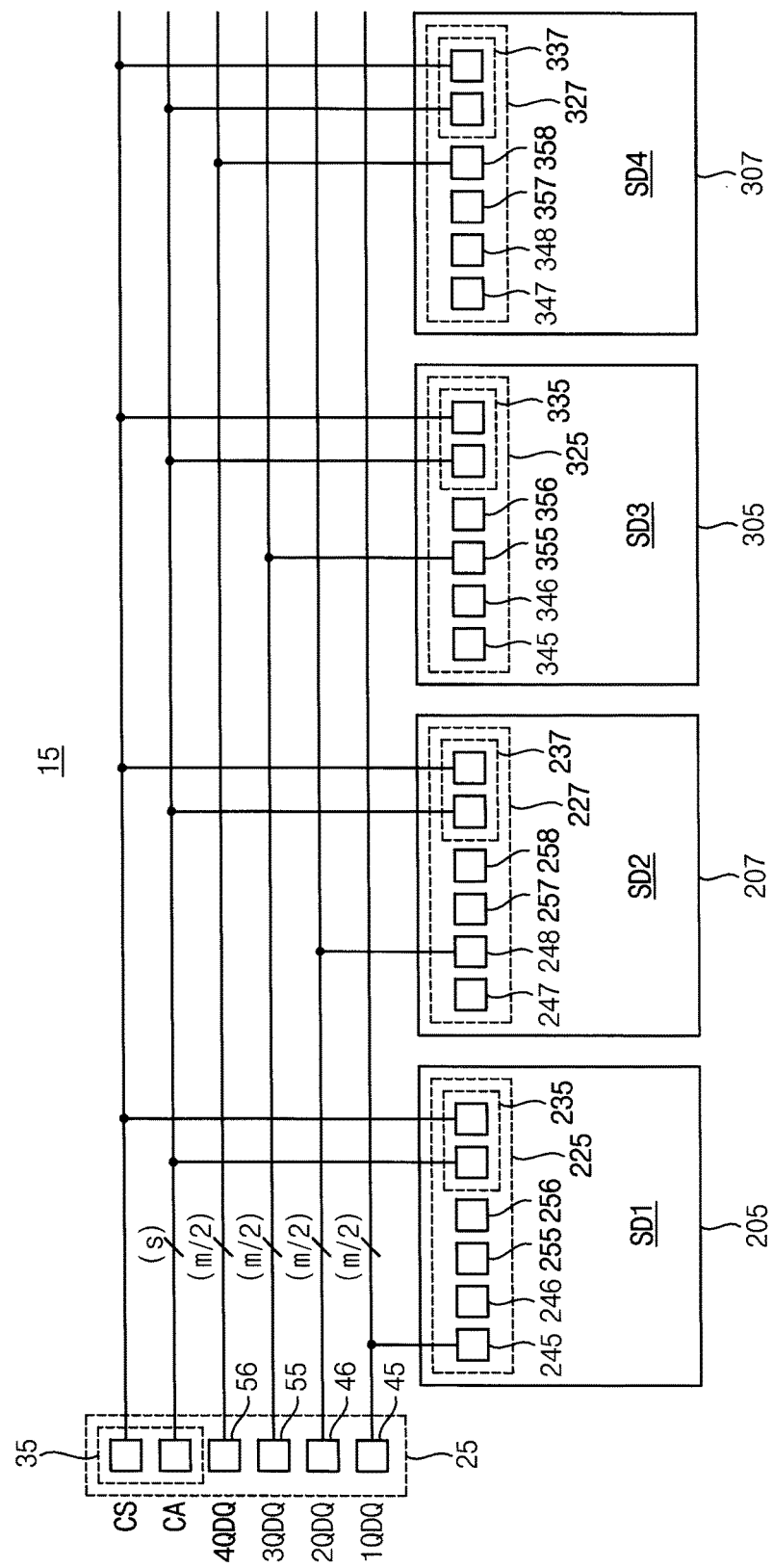
FIG. 20 is a circuit diagram illustrating a stacked memory chip according to example embodiments.
Figure 21:
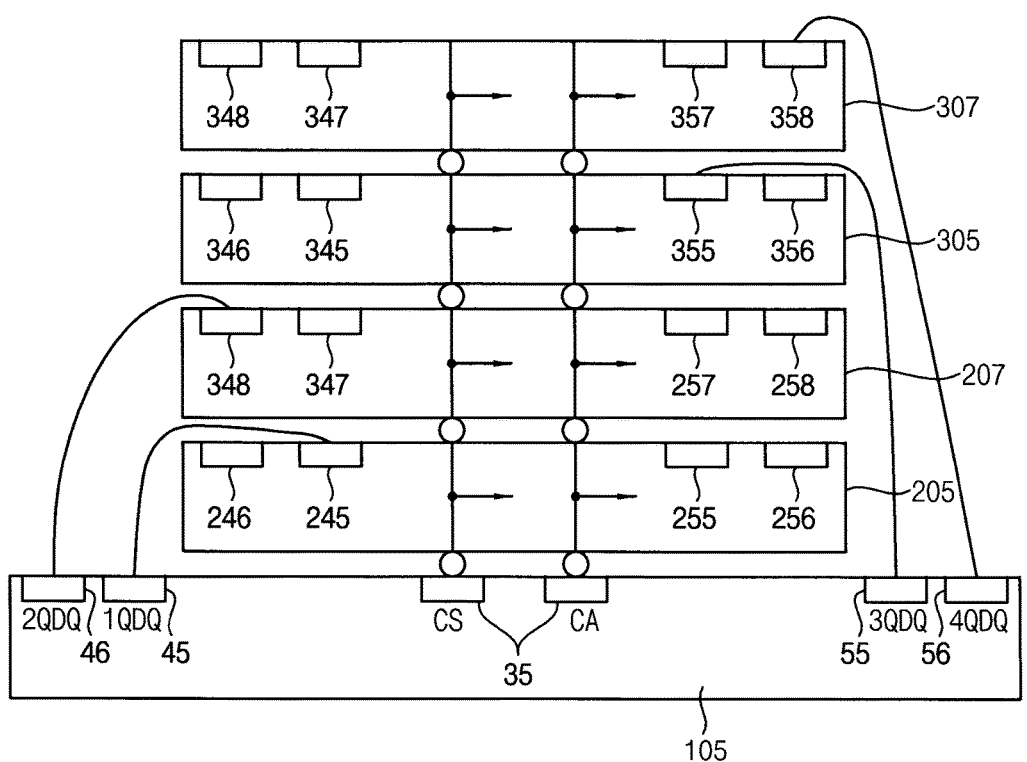
FIG. 21 is a cross-sectional diagram illustrating an example embodiment of the memory chip of FIG. 20.

FIG. 20 is a circuit diagram illustrating a stacked memory chip according to example embodiments, and FIG. 21 is a cross-sectional diagram illustrating an example embodiment of the memory chip of FIG. 20.

Referring to FIGS. 20 and 21, a stacked memory chip 15 includes abase substrate 105 including a chip input-output pad unit 35, a first semiconductor die SD1 205, a second semiconductor die SD2 207, a third semiconductor die SD3 305 and a fourth semiconductor die 307.

The chip input-output pad unit 25 includes a chip command-address pad unit 35, a first chip quarter data pad unit 45, a second chip quarter data pad unit 46, a third chip quarter data pad unit 55 and a fourth chip quarter data pad unit 56 that are to be connected to an external device. For example, the chip command-address pad unit 35 may include s+1 pads for receiving a common chip selection signal CS and command-address signals CA. The first chip quarter data pad unit 45 may include m/2 pads for communicating first quarter data 1QDQ, the second chip quarter data pad unit 46 may include m/2 pads for communicating second quarter data 2QDQ, the third chip quarter data pad unit 55 may include m/2 pads for communicating third quarter data 3QDQ and the fourth chip quarter data pad unit 56 may include m/2 pads for communicating fourth quarter data 4QDQ.

The first through fourth semiconductor dies 205, 207, 305 and 307 may include die input-output pad units 225, 227, 325 and 327 of a same configuration, respectively, and each of the die input-output pad units 225, 227, 325 and 327 may correspond to the chip input-output pad unit 25 such that each of the die input-output pad units 225, 227, 325 and 327 may include the same number of pads for communicating the same signals as the chip input-output pad unit 25.

The die input-output pad unit 225 of the first semiconductor die 205 includes a die command-address pad unit 235 corresponding to the chip command-address pad unit 35, a first die quarter data pad unit 245 corresponding to the first chip quarter data pad unit 45, a second die quarter data pad unit 246 corresponding to the second chip quarter data pad unit 46, a third die quarter data pad unit 255 corresponding to the third chip quarter data pad unit 55 and a fourth die quarter data pad unit 256 corresponding to the fourth chip quarter data pad unit 56. The die input-output pad unit 227 of the second semiconductor die 207 includes a die command-address pad unit 237 corresponding to the chip command-address pad unit 35, a first die quarter data pad unit 247 corresponding to the first chip quarter data pad unit 45, a second die quarter data pad unit 248 corresponding to the second chip quarter data pad unit 46, a third die quarter data pad unit 257 corresponding to the third chip quarter data pad unit 55 and a fourth die quarter data pad unit 258 corresponding to the fourth chip quarter data pad unit 56.

The die input-output pad unit 325 of the third semiconductor die 305 includes a die command-address pad unit 335 corresponding to the chip command-address pad unit 35, a first die quarter data pad unit 345 corresponding to the first chip quarter data pad unit 45, a second die quarter data pad unit 346 corresponding to the second chip quarter data pad unit 46, a third die quarter data pad unit 355 corresponding to the third chip quarter data pad unit 55 and a fourth die quarter data pad unit 356 corresponding to the fourth chip quarter data pad unit 56. The die input-output pad unit 327 of the fourth semiconductor die 307 includes a die command-address pad unit 337 corresponding to the chip command-address pad unit 35, a first die quarter data pad unit 347 corresponding to the first chip quarter data pad unit 45, a second die quarter data pad unit 348 corresponding to the second chip quarter data pad unit 46, a third die quarter data pad unit 357 corresponding to the third chip quarter data pad unit 55 and a fourth die quarter data pad unit 358 corresponding to the fourth chip quarter data pad unit 56.

The die command-address pad units 235, 237, 335 and 337 of the first through fourth semiconductor dies 205, 207, 305 and 307 may be connected commonly to the chip command-address pad unit 35.

Among the data pad units 245, 246, 255 and 256 of the first semiconductor die 205, only the first die quarter data pad unit 245 may be electrically connected to the first chip quarter data pad unit 45. Among the data pad units 247, 248, 257 and 258 of the second semiconductor die 207, only the second die quarter data pad unit 248 may be electrically connected to the second chip quarter data pad unit 46. Among the data pad units 345, 346, 355 and 356 of the third semiconductor die 305, only the third die quarter data pad unit 355 may be electrically connected to the third chip quarter data pad unit 55. Among the data pad units 347, 348, 357 and 358 of the fourth semiconductor die 307, only the fourth die quarter data pad unit 358 may be electrically connected to the fourth chip quarter data pad unit 56.

The first through fourth semiconductor dies 205, 207, 305 and 307 may receive the common chip selection signal CS and may be selected and accessed simultaneously when the common chip selection signal CS is activated.

As such, the input-output load may be reduced by selectively connecting each of the stacked semiconductor dies 205, 207, 305 and 307 to one of the four chip quarter data pad units, thereby increasing the operation speed and decreasing the power consumption. Through such reduction of the input-output load, the number of the stacked semiconductor dies may be further increased and the memory device of a higher memory capacity may be implemented efficiently.

Hereinafter, example embodiments are described for a memory device conforming to the standard of low-power double data rate 4 (LPDDR4) of Joint Electron Device Engineering Council (JEDEC) with reference to FIGS. 22 through 25.

Figure 22:
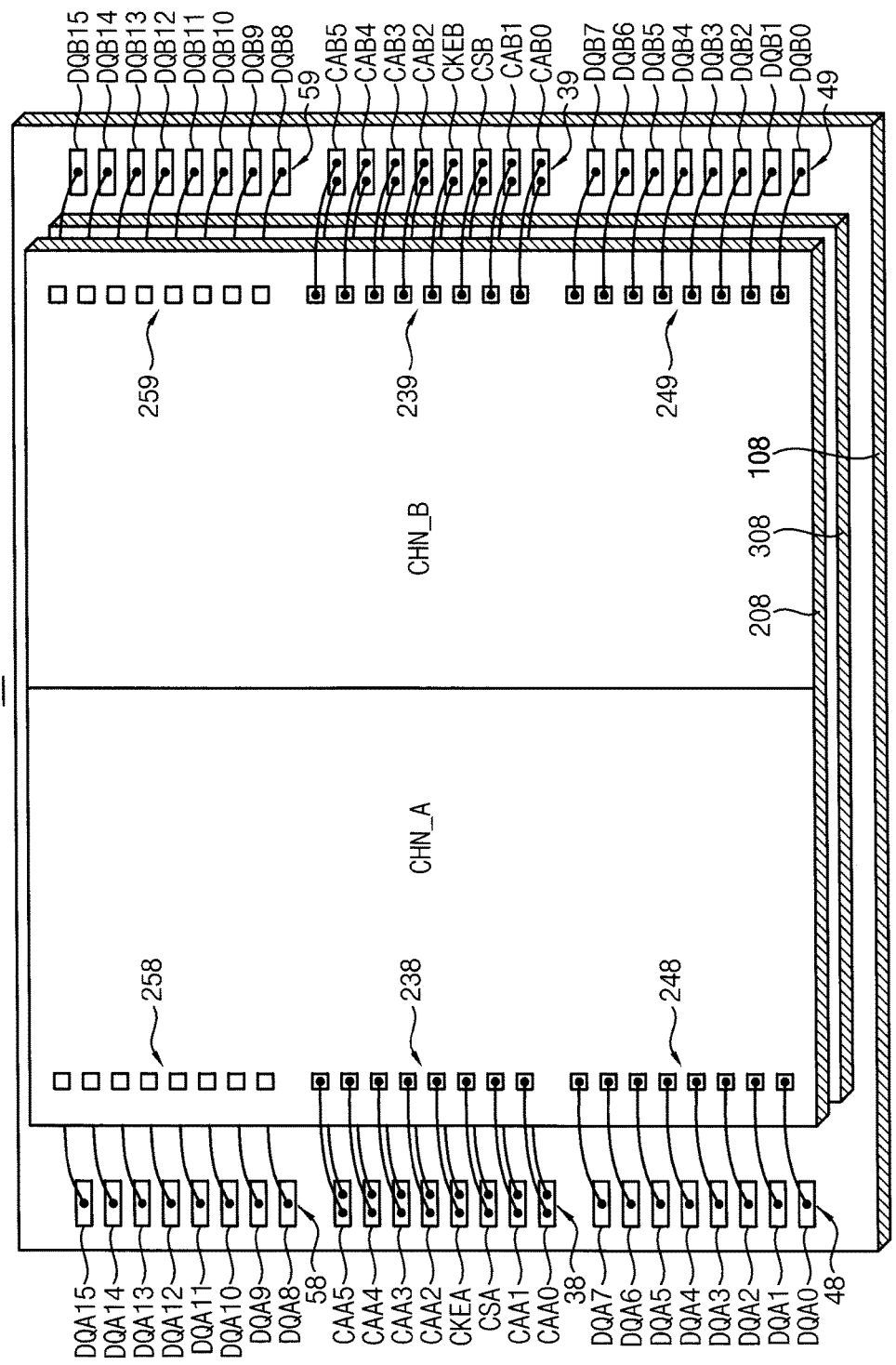
FIG. 22 is a perspective view of a stacked memory chip according to an example embodiment.

FIG. 22 is a perspective view of a stacked memory chip according to an example embodiment.

Referring to FIG. 22, a stacked memory chip 18 may include abuse substrate 108 and a plurality of semiconductor dies stacked on the based substrate. FIG. 22 illustrates a first semiconductor die 208 and a second semiconductor die 308 for convenience of illustration and three or more semiconductor dies may be packaged in the single memory chip 18.

The base substrate 108 may include a first chip input-output pad unit corresponding to a first channel region CHN_A and a second input-output pad unit corresponding to a second channel region CHN_B. The first chip input-output pad unit may include a first chip command-address pad unit 38, a first lower chip data pad unit 48 and a first upper chip data pad unit 58 that are to be connected to an external device. The second chip input-output pad unit may include a second chip command-address pad unit 39, a second lower chip data pad unit 49 and a second upper chip data pad unit 59 that are to be connected to the external device.

The first chip command-address pad unit 38 may include a plurality of pads for receiving a first chip selection signal CSA, a first clock enable signal CKEA and first command-address signals CAA0~CAA5. The first lower chip data pad unit 48 may include eight pads for communicating lower data DQA0~DQA7 of eight bits and the first upper chip data pad unit 58 may include eight pads for communicating upper data DQA8~DQA15 of eight bits.

The second chip command-address pad unit 39 may include a plurality of pads for receiving a second chip selection signal CSB, a second clock enable signal CKEB and second command-address signals CAB0~CAB5. The second lower chip data pad unit 49 may include eight pads for communicating lower data DQB0~DQB7 of eight bits and the second upper chip data pad unit 59 may include eight pads for communicating upper data DQB8~DQB15 of eight bits.

Each of the first semiconductor die 208 and the second semiconductor die 308 may include the first channel region CHN_A and the second channel region CHN_B that are operated independently of each other. FIG. 22 illustrates the first semiconductor die 208 stacked on the second semiconductor die 308, and only the die input-output pad unit 238, 239, 248, 249, 258 and 259 of the first semiconductor die 208 is illustrated for convenience of illustration. The first semiconductor die 208 and the second semiconductor die 308 may include the die input-output pad units of the same configuration, and each of the die input-output pad units of the first and second semiconductor dies 208 and 308 may correspond to the chip input-output pad unit such that each of the die input-output pad units may include the same number of pads for communicating the same signals as the chip input-output pad unit.

The first semiconductor die 208 may include a first die input-output pad unit corresponding to the first channel region CHN_A and a second die input-output pad unit corresponding to the second channel region CHN_B. The first die input-output pad unit may include a first die command-address pad unit 238 corresponding to the first chip command-address pad unit 38, a first lower die data pad unit 248 corresponding to the first lower chip data pad unit 48 and a first upper die data pad unit 258 corresponding to the first upper chip data pad unit 58. The second die input-output pad unit may include a second die command-address pad unit 39 corresponding to the second chip command-address pad unit 39, a second lower die data pad unit 249 corresponding to the second lower chip data pad unit 49 and a second upper die data pad unit 259 corresponding to the second upper chip data pad unit 59. Even though not illustrated in FIG. 22, the second semiconductor die 308 may include a first die input-output pad unit corresponding to the first channel region CHN_A and a second die input-output pad unit corresponding to the second channel region CHN_B of the same configuration as the first semiconductor die 208.

The die command-address pad units 238 and 239 of the first semiconductor die 208 and the die command-address pad units (not shown) of the second semiconductor die 308 may be connected commonly to the chip command-address pad units 38 and 39. The lower die data pad units 248 and 249 of the first semiconductor die 208 may be electrically connected to the lower chip data pad units 48 and 49 and the upper die data pad units 258 and 259 of the first semiconductor die 208 may be electrically disconnected from the upper chip data pad units 58 and 59. The upper die data pad units (not shown) of the second semiconductor die 308 may be electrically connected to the upper chip data pad units 58 and 59 and the lower die data pad units (not shown) of the second semiconductor die 308 may be electrically disconnected from the lower chip data pad units 48 and 49.

As illustrated in FIG. 22, the first semiconductor die 208 and the second semiconductor die 308 may be connected to the lower chip data pad units 48 and 49 and the upper chip data pad units 58 and 59 through bonding wires, respectively. In addition, the first semiconductor die 208 and the second semiconductor die 308 may be connected commonly to the chip command-address pad units 38 and 39 through the bonding wires. In other example embodiments, the first semiconductor die 208 and the second semiconductor die 308 may be connected commonly to the chip command-address pad units 38 and 39 using through-silicon vias (TSV) as illustrated in FIG. 11.

FIG. 23 is a diagram for describing an addressing scheme of the stacked memory chip of FIG. 22.

Referring to FIG. 23, each semiconductor die may have the memory capacity or the memory density of 4 Gb, 8 Gb or 16 Gb, and each channel may have the memory density of 2 Gb, 4 Gb or 2 Gb when each semiconductor die includes two channels. Each channel may include eight memory banks regardless of the memory density, and the bank address may be determined using the three address bits BA0, BA1 and BA2 regardless of the memory density. When the data width or the number of the data pads per channel is sixteen, the number of the address bits R0~R15 for indicating the row address may be increased according to the increase of the memory density. The number of the address bits C0~C9 for indicating the column address may be fixed.

As described with reference to FIGS. 10, 11 and 12, when the stacked memory chip 11 includes the two semiconductor dies of the memory capacity of 8 Gb, respectively, the memory controller 551 may control the access to the stacked memory chip 11 through the one chip selection signal CS and the address bit signals corresponding to the two times (e.g., 16 Gb) of the memory capacity (e.g., 8 Gb) of each semiconductor die. The memory controller 551 may provide the most significant address bit signal R15 to the stacked memory chip 11 in addition to other address bit signals R0~R14 that are required for accessing the one semiconductor die of 8 Gb. The above mentioned path selection signal PSEL may be generated based on the common chip selection signal CS and the most significant address bit signal R15.

Figure 25:
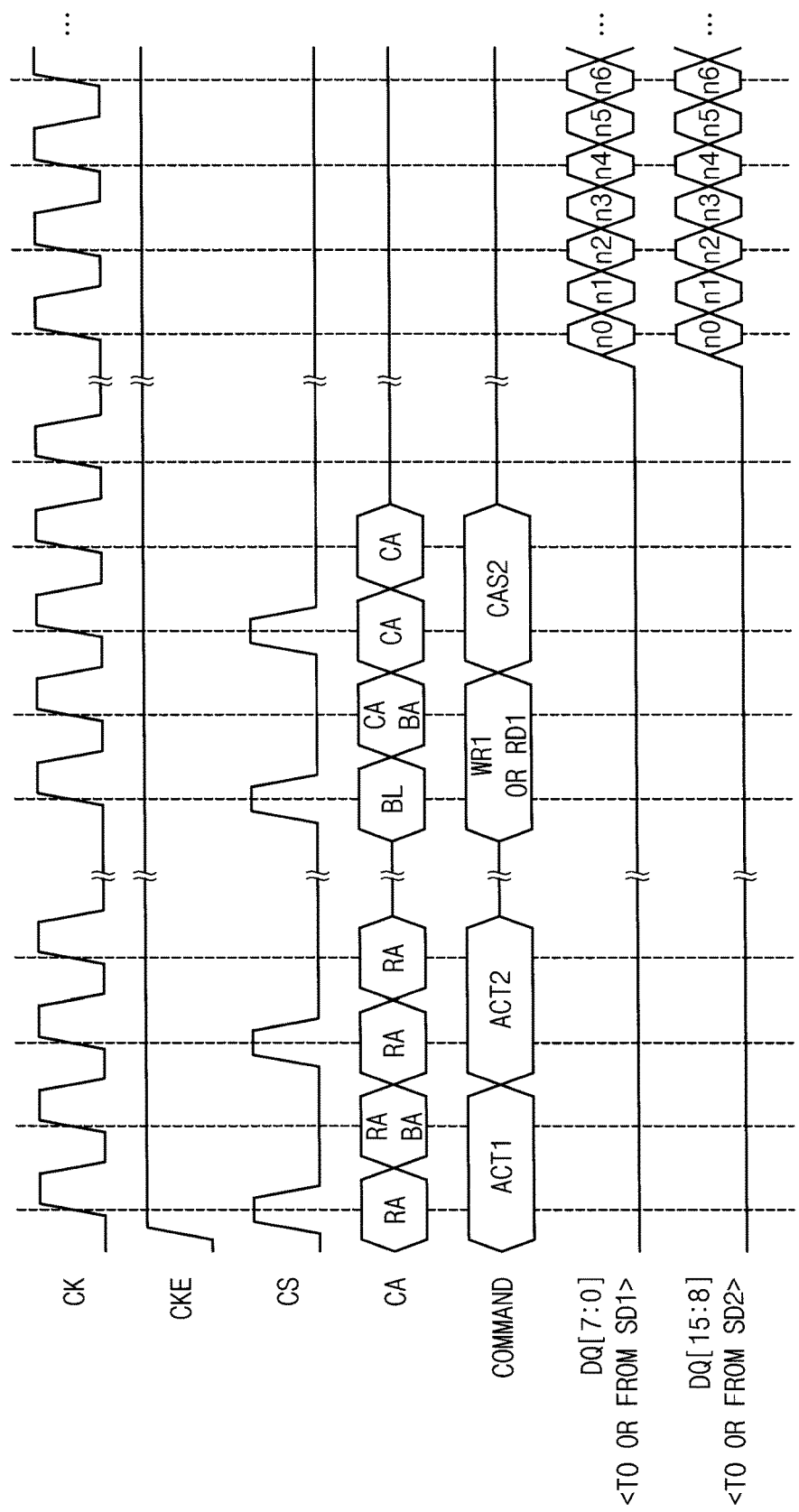
FIG. 25 is a timing diagram illustrating an operation of the stacked memory chip of FIG. 22.

FIG. 24 is a diagram illustrating a portion of commands in the stacked memory chip of FIG. 22, and FIG. 25 is a timing diagram illustrating an operation of the stacked memory chip of FIG. 22.

FIG. 24 illustrates combinations of the chip selection signal CS and the command-address signals CA0~CA5 representing a first active command ACT1, a second active command ACT2, a first write command WR1, a first read command RD1 and a second CAS command CAS2. H indicates the logic high level, L indicates the logic low level, R0~R15 indicate bits of the row address RA, BA0~BA2 indicate bits of the bank address BA, V indicates any one of the logic low level and the logic high level, BL indicates the burst length, C2~C8 indicate bits of the column address CA, AP indicates an auto precharge. R1 indicates a first rising edge of the clock signal CK and R2 indicates a second rising edge of the clock signal CK.

FIG. 25 illustrates a sequence corresponding to a burst read operation or a burst write operation. An active command may be represented by a combination of a first active command ACT1 and a second active command ACT2, a read command may be represented by a first read command RD1 and a second CAS command CAS2, and a write command may be represented by a first write command WR1 and a second CAS command CAS2. As such, the stacked memory chip 18 of FIG. 22 may receive the command and the address during a plurality of clock cycles (e.g., four clock cycles). The clock enable signal CKE may maintain the logic high level while the command is input to the memory chip 18.

According to example embodiments, the lower die data pad unit of the first semiconductor die SD1 may be electrically connected to the lower chip data pad unit to communicate the lower data DQ[7:0] and the upper die data pad unit of the first semiconductor die SD1 may be electrically disconnected from the upper chip data pad unit. The upper die data pad unit of the second semiconductor die SD2 may be electrically connected to the upper chip data pad unit to communicate the upper data DQ[15:8] and the lower die data pad unit of the second semiconductor die SD2 may be electrically disconnected from the lower chip data pad unit. As such, the input-output load may be reduced by selectively connecting each of the stacked semiconductor dies to one of the lower chip data pad unit and the upper chip data pad unit, thereby increasing the operation speed and decreasing the power consumption.

Figure 26:
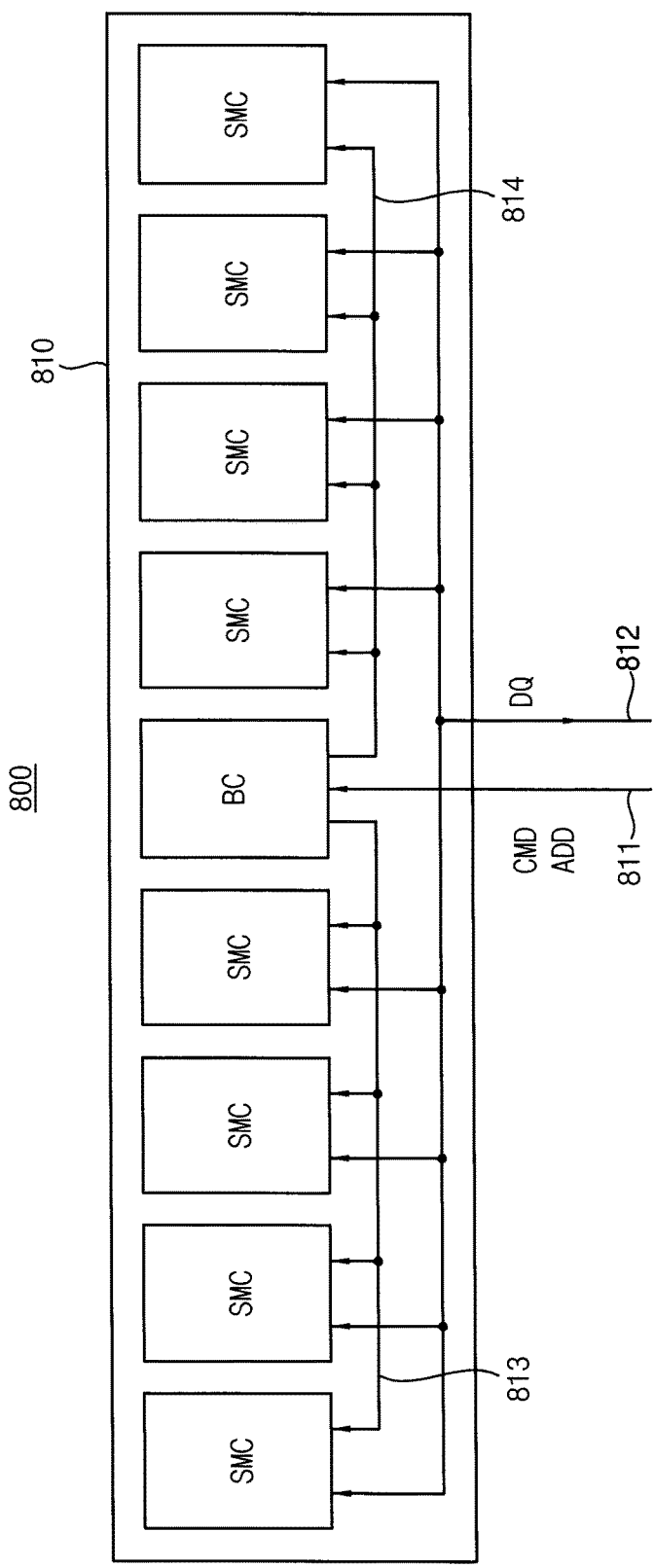
FIG. 26 is a block diagram illustrating a memory module according to example embodiments.

FIG. 26 is a block diagram illustrating a memory module according to example embodiments.

Referring to FIG. 26, a memory module 800 may include a module substrate 810, a plurality of stacked memory chips SMC and a buffer chip BC.

The stacked memory chips SMC may be mounted on the module substrate 810 and each of the stacked memory chips SMC may receive data DQ from an external device such as a memory controller through a data bus 812 in a write mode, or transmit the data DQ to the external device through the data bus 812 in a read mode.

The buffer chip BC may be mounted on the module substrate 810 and the buffer chip BC may receive command signals CMD and address signals ADD through a control bus 511 to provide the received signals CMD and ADD to the stacked memory chips SMC through internal buses 513 and 514. The buffer chip BC may include a register to store control information of the memory module 800.

Each stacked memory chip SMC may include a plurality of semiconductor dies that are stacked vertically. As described above, each of the semiconductor dies may be electrically connected to the chip command-address pad unit and the lower chip data pad unit and electrically disconnected from the upper chip data pad unit, or each of the semiconductor die may be electrically connected to the chip command-address pad unit and the upper chip data pad unit and electrically disconnected from the lower chip data pad unit. As such, the input-output load may be reduced by selectively connecting each of the stacked semiconductor dies to one of the lower chip data pad unit and the upper chip data pad unit, thereby increasing the operation speed and decreasing the power consumption.

Figure 27:
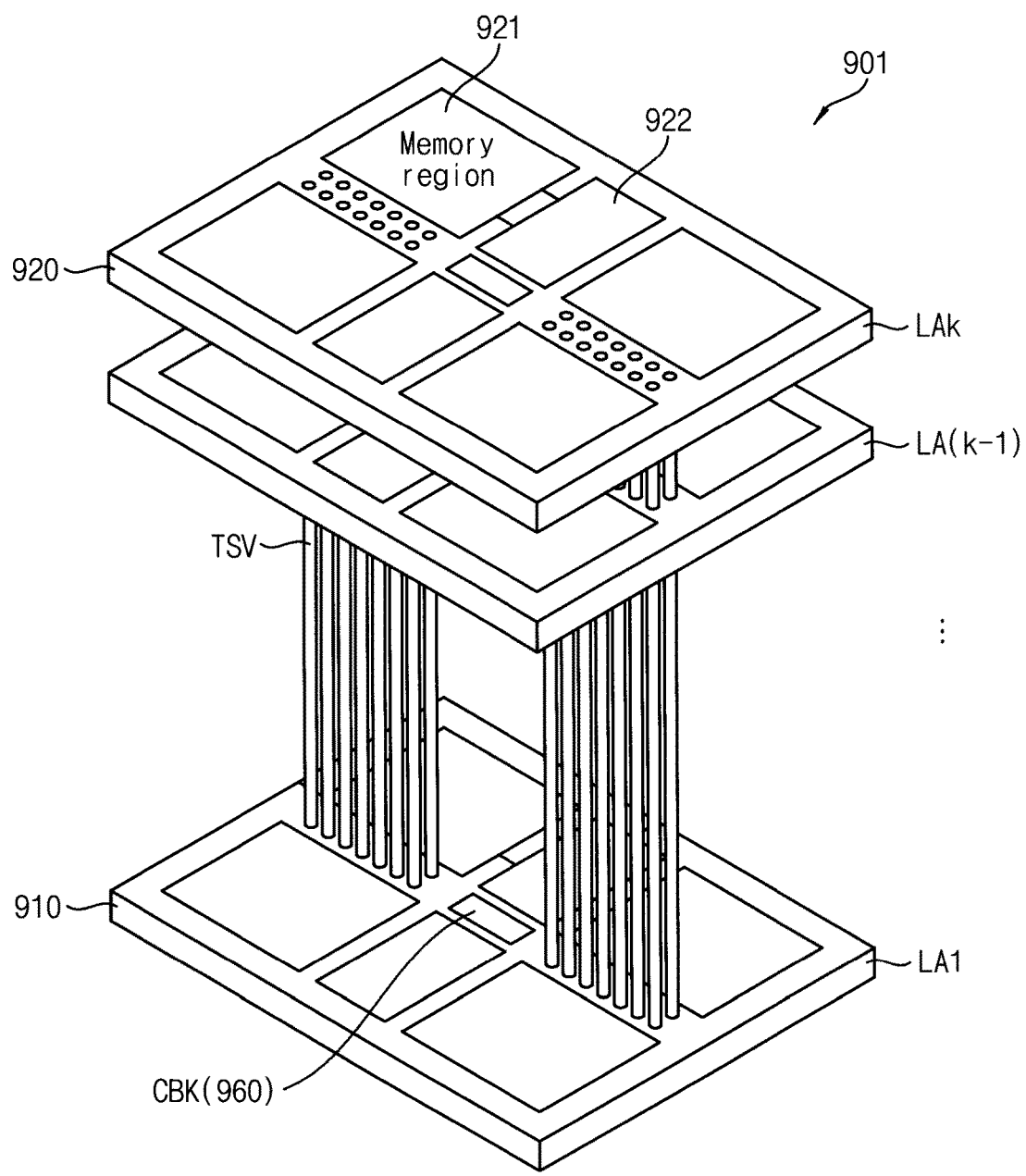
FIG. 27 is a diagram illustrating a structure of a stacked memory device according to example embodiments.

FIG. 27 is a diagram strafing a structure of a stacked memory device according to example embodiments.

Referring to FIG. 27, a semiconductor memory device 901 may include first through kth semiconductor integrated circuit layers LA1 through LAk, in which the lowest first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias through-silicon vias TSVs). The lowest first semiconductor integrated circuit layer LA1 as the master layer may communicate with an external memory controller through a conductive structure formed on an external surface.

The first semiconductor integrated circuit layer 910 through the kth semiconductor integrated circuit layer 920 may include memory regions 921 and various peripheral circuits 922 for driving the memory regions 921. For example, the peripheral circuits may include a row (X)-driver for driving wordlines of a memory, a column (Y)-driver for driving bit lines of the memory, a data input/output unit for controlling input/output of data, a command buffer for receiving a command from outside and buffering the command, and an address buffer for receiving an address from outside and buffering the address.

The first semiconductor integrated circuit layer 910 may further include a control logic and the control logic may generate control signals to control the memory region 921 based on the command-address signals from the memory controller.

The first semiconductor integrated circuit layer 910 through the kth semiconductor integrated circuit layer 920 may include the above described conversion block CBK 960. The first semiconductor integrated circuit layer 910 through the kth semiconductor integrated circuit layer 920 may electrically connect the internal circuit to the through-silicon via TSV to the lower chip data pad unit or the through-silicon via TSV to the upper chip data pad unit using the conversion block 960.

Figure 28:
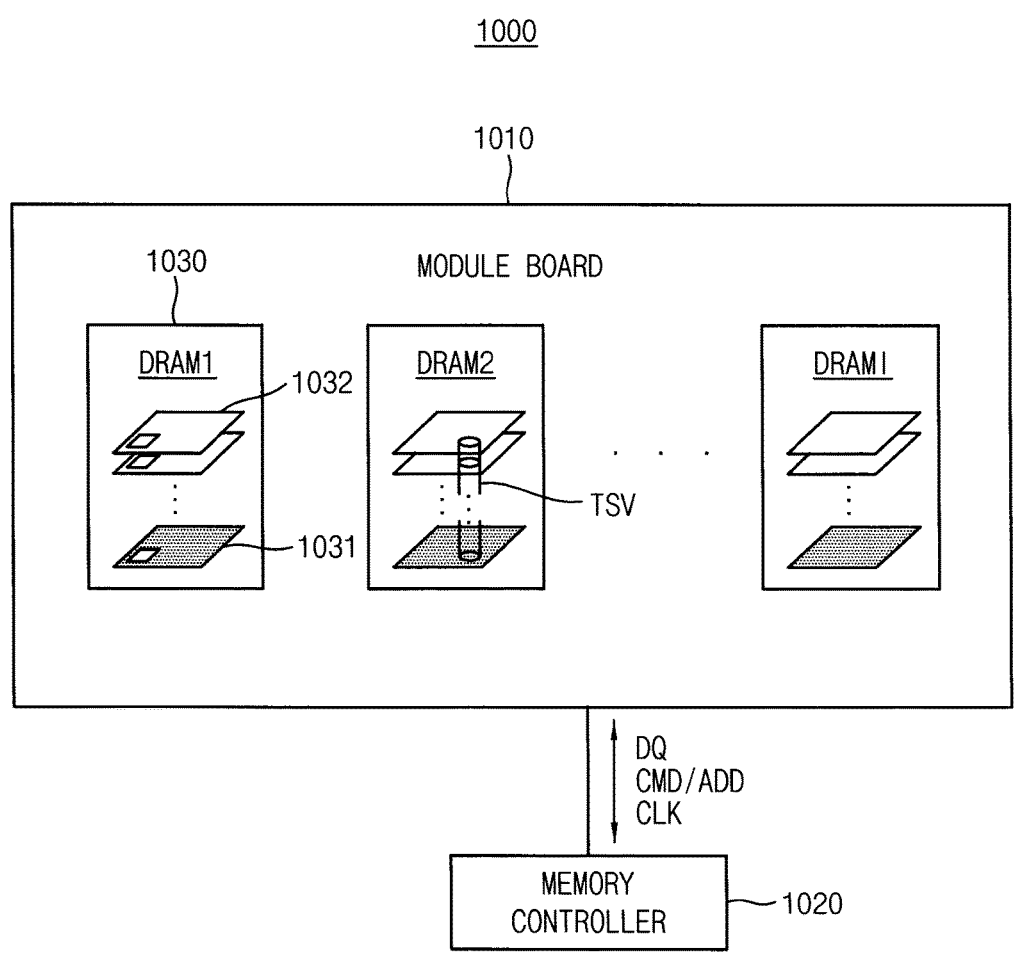
FIG. 28 is a block diagram illustrating a memory system according to example embodiments.

FIG. 28 is a block diagram illustrating a memory system according to example embodiments.

Referring to FIG. 28, a memory system 1000 may include a memory module 1010 and a memory controller 1020. The memory module 1010 may include at least one semiconductor memory device 1030 mounted on a module substrate. For example, the semiconductor memory device 1030 may be constructed as a DRAM chip. In addition, the semiconductor memory device 1030 may include a stack of semiconductor dies. In some example embodiments, the semiconductor dies may include the master die 1031 and the slave dies 1032. Signal transfer between the semiconductor chips may occur via through-substrate vias (e.g., through-silicon vias TSV) and/or bonding wires.

The memory module 1010 may communicate with the memory controller 1020 via a system bus. Data DQ, a command/address CMD/ADD, and a clock signal CLK may be transmitted and received between the memory module 1010 and the memory controller 1020 via the system bus.

As described above, some of the semiconductor dies in the semiconductor memory device 1030 may be electrically connected to the chip command-address pad unit 30 and the lower chip data pad unit 40 associated with semiconductor memory device 1030 and electrically disconnected from the upper chip data pad unit 50 associated with the semiconductor memory device 1030, and others of the semiconductor dies may be electrically connected to the chip command-address pad unit and the upper chip data pad unit and electrically disconnected from the lower chip data pad unit. As such, the input-output load may be reduced by selectively connecting each of the stacked semiconductor dies to one of the lower chip data pad unit and the upper chip data pad unit associated with the semiconductor memory device 1030, thereby increasing the operation speed and decreasing the power consumption of the semiconductor memory device 1030.

Figure 29:
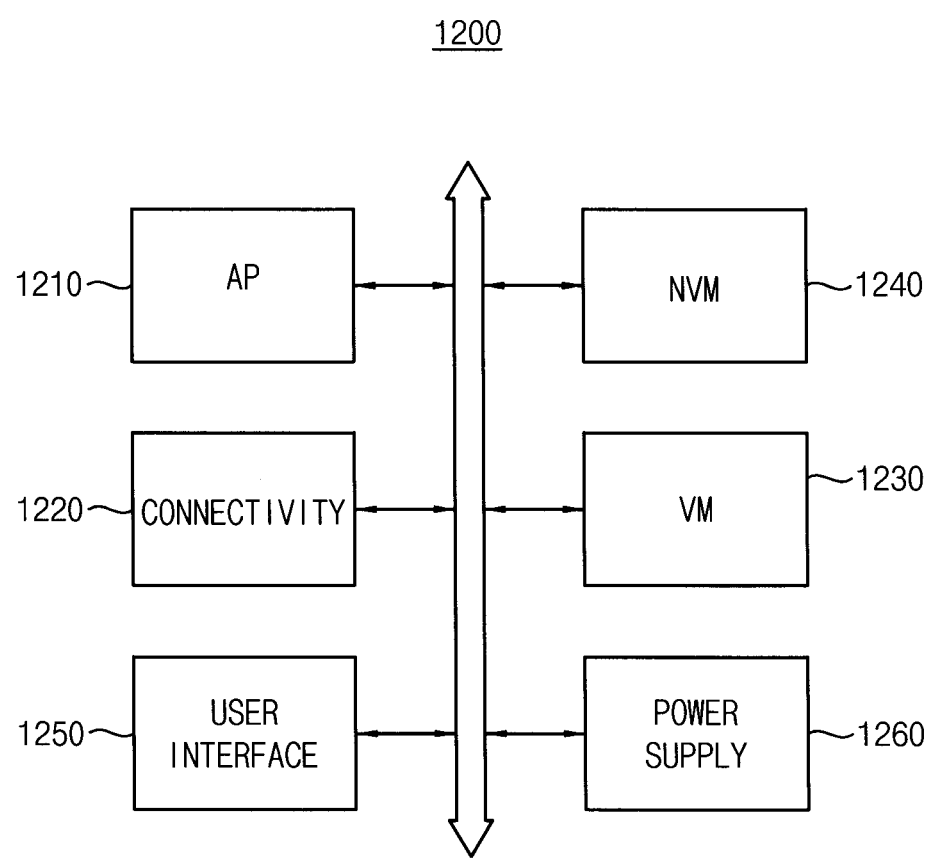
FIG. 29 is a block diagram illustrating a mobile system according to example embodiments.

FIG. 29 is a block diagram illustrating a mobile system according to example embodiments.

Referring to FIG. 29, a mobile system 1200 includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The volatile memory 1230 may include at least one stacked memory chip and the stacked memory chip may include a plurality of semiconductor dies that are stacked. As described above, each of the semiconductor dies may be electrically connected to the chip command-address pad unit and the lower chip data pad unit and electrically disconnected from the upper chip data pad unit, or each of the semiconductor die may be electrically connected to the chip command-address pad unit and the upper chip data pad unit and electrically disconnected from the lower chip data pad unit. As such, the input-output load may be reduced by selectively connecting each of the stacked semiconductor dies to one of the lower chip data pad unit and the upper chip data pad unit, thereby increasing the operation speed and decreasing the power consumption.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a poly random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 30:
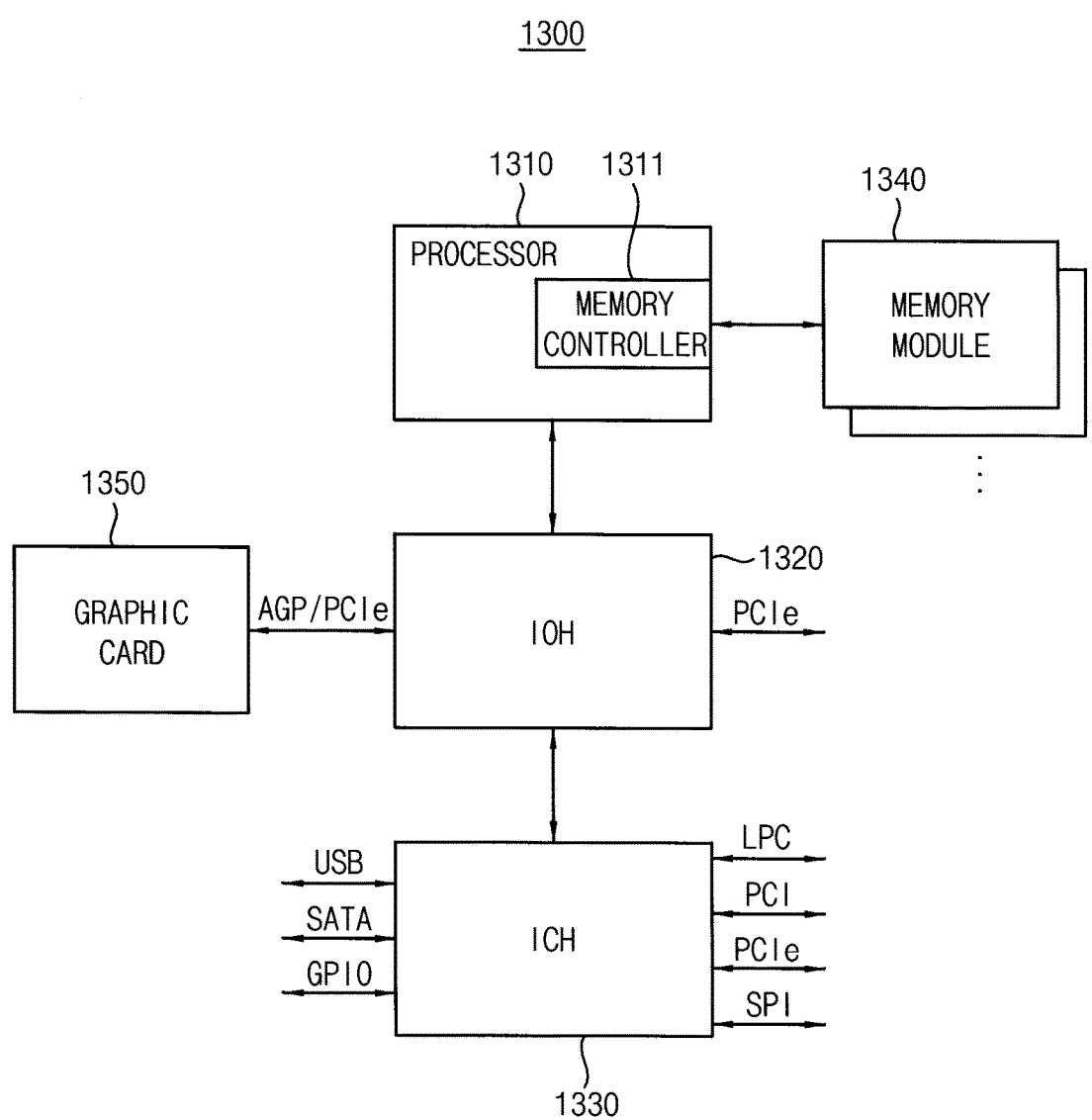
FIG. 30 is a block diagram illustrating a computing system according to example embodiments.

FIG. 30 is a block diagram illustrating a computing system according to example embodiments.

Referring to FIG. 30, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 30 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340.

The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320 which may be referred to as memory controller hub (MCH).

The memory module 1340 may include at least one stacked memory chip and the stacked memory chip may include a plurality of semiconductor dies that are stacked. As described above, each of the semiconductor dies may be electrically connected to the chip command-address pad unit and the lower chip data pad unit and electrically disconnected from the upper chip data pad unit, or each of the semiconductor die may be electrically connected to the chip command-address pad unit and the upper chip data pad unit and electrically disconnected from the lower chip data pad unit. As such, the input-output load may be reduced by selectively connecting each of the stacked semiconductor dies to one of the lower chip data pad unit and the upper chip data pad unit, thereby increasing the operation speed and decreasing the power consumption.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 30 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller huh 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output huh 1320 and the input/output controller hub 1330 may be implemented as a single chipset. Also, while many features of the embodiments are disclosed as units, in other embodiments those features may be implemented as other forms of logic including but not limited to code-based operations performed by a processor.

As such, the stacked memory chip, the memory module and the memory system according to example embodiments may be applied adaptively to various devices and systems to reduce the input-output load, thereby increasing the operation speed and decreasing the power consumption.

The present disclosure may be applied to arbitrary devices and systems including a memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stacked memory chip comprising:
   chip input-output (I/O) pads configured to connect to an external device, the chip I/O pads including a chip command-address pad, a lower chip data pad and an upper chip data pad; and
   a plurality of semiconductor dies including a first semiconductor die and a second semiconductor die, each of the plurality of semiconductor dies including die I/O pads, a memory device, and a conversion block, the die I/O pads including a die command-address pad, a lower die data pad and an upper die data pad corresponding to the chip command-address pad, the lower chip data pad, and the upper chip data pad, respectively, the memory device having a memory core and an I/O buffer, the I/O buffer including a lower I/O buffer and an upper I/O buffer corresponding to the lower die data pad and the upper die data pad, respectively, the I/O buffer configured to buffer data exchanged between the memory core and the die I/O pads, and the conversion block configured to electrically connect one of the lower I/O buffer and the upper I/O buffer to the die I/O pads associated with a respective one of the semiconductor dies such that the first semiconductor die is electrically connected to the chip command-address pad and the lower chip data pad while being electrically isolated from the upper chip data pad, and the second semiconductor die is electrically connected to the chip command-address pad and the upper chip data pad while being electrically isolated from the lower chip data pad.

2. The stacked memory chip of claim 1, wherein
the upper die data pad of the first semiconductor die is electrically disconnected from a memory device associated with the first semiconductor die such that the upper die data pad associated with the first semiconductor die is a floating node, and
the lower die data pad of the second semiconductor die is electrically disconnected from a memory device associated with the second semiconductor die such that the lower die data pad associated with the second semiconductor die is a floating node.

3. The stacked memory chip of claim 1, wherein the plurality of semiconductor dies further include:
a third semiconductor die configured to electrically connect to the chip command-address pad and the lower chip data pad while being electrically isolated from the upper chip data pad; and
a fourth semiconductor die configured to electrically connect to the chip command-address pad and the upper chip data pad while being electrically isolated from the lower chip data pad.

4. The stacked memory chip of claim 3, wherein
the first semiconductor die and the second semiconductor die are configured to receive a first common chip selection signal, and to simultaneously activate when the first common chip selection signal is activated, and
the third semiconductor die and the fourth semiconductor die are configured to receive a second common chip selection signal, and simultaneously activate when the second common chip selection signal is activated.

5. The stacked memory chip of claim 1, wherein each of the first semiconductor die and the second semiconductor die include a first channel region and a second channel region, the first channel region configured to operate independently of the second channel region.

6. The stacked memory chip of claim 1, wherein the stacked memory chip is configured to receive a command and an address through the chip command-address pad during a plurality of clock cycles.

7. A stacked memory chip comprising:
chip input-output (I/O) pads configured to connect to an external device, the chip I/O pads including a chip command-address pad, a lower chip data pad and an upper chip data pad; and
a plurality of semiconductor dies including,
a first semiconductor die configured to electrically connect to the chip command-address pad and the lower chip data pad while being electrically isolated from the upper chip data pad, and
a second semiconductor die configured to electrically connect to the chip command-address pad and the upper chip data pad while being electrically isolated from the lower chip data pad,
wherein each of the first semiconductor die and the second semiconductor die include,
die I/O pads, the die I/O pads including a die command-address pad, a lower die data pad and an upper die data pad corresponding to the chip command-address pad, the lower chip data pad, and the upper chip data pad, respectively,
a memory device having a memory core and an I/O buffer, the I/O buffer configured to buffer data exchanged between the memory core and the die I/O pads, the I/O buffer including a lower I/O buffer and an upper I/O buffer corresponding to the lower die data pad and the upper die data pad, respectively, and the memory core having a plurality of memory cells formed therein, and
a conversion block configured to electrically connect the I/O buffer to one of the lower die data pad and the upper die data pad.

8. The stacked memory chip of claim 7, wherein the conversion block includes:
a switch block connected to the lower I/O buffer and the upper I/O buffer of a respective one of the plurality of semiconductor dies;
a first fuse array connected between the switch block and the lower die data pad of a respective one of the plurality of semiconductor dies; and
a second fuse array connected between the switch block and the upper die data pad of a respective one of the plurality of semiconductor dies, and
wherein the switch block is configured to cut one of the first fuse array and the second fuse array associated with a respective one of the plurality of semiconductor dies.

9. The stacked memory chip of claim 8, wherein
the second fuse array of the first semiconductor die is cut such that the upper die data pad of the first semiconductor die is a floating node, and
the first fuse array of the second semiconductor die is cut such that the lower die data pad of the second semiconductor die is a floating node.

10. The stacked memory chip of claim 7, wherein the conversion block is configured to electrically connect one of the lower I/O buffer and the upper I/O buffer to the die I/O pads associated with a respective one of the semiconductor dies in response to a path selection signal.

11. The stacked memory chip of claim 7, wherein the I/O buffer is configured to enable one of the lower I/O buffer and the upper I/O buffer in response to a path selection signal.

12. The stacked memory chip of claim 7, wherein the first semiconductor die and the second semiconductor die are configured to receive a common chip selection signal such that the first semiconductor die and the second semiconductor die simultaneously activate when the common chip selection signal is activated.

13. The stacked memory chip of claim 12, further comprising:
a path controller configured to generate a path selection signal based on the common chip selection signal and a most significant address bit signal,
wherein the conversion block is configured to electrically connect one of the lower I/O buffer and the upper I/O buffer to the die I/O pads in response to the path selection signal.

14. The stacked memory chip of claim 7, wherein the first semiconductor die and the second semiconductor die are both configured to receive a first chip selection signal and a second chip selection signal, and to simultaneously activate when one of the first chip selection signal and the second chip selection signal is activated.

15. The stacked memory chip of claim 14, further comprising:
a path controller configured to generate a path selection signal based on the first chip selection signal and the second chip selection signal, wherein the conversion block is configured to electrically connect one of the lower I/O buffer and the upper I/O buffer to the die I/O pads in response to the path selection signal.

16. A memory system comprising:
a memory controller; and
at least one stacked memory chip configured to receive control signals from the memory controller, the stacked memory chip including,
chip input-output (I/O) pads configured to electrically connect to the memory controller, the chip I/O pads including a chip command-address pad, a lower chip data pad and an upper chip data pad; and
a plurality of semiconductor dies each including die I/O pads, a memory device, and a conversion block, the die I/O pads including a die command-address pad, a lower die data pad and an upper die data pad corresponding to the chip command-address pad, the lower chip data pad, and the upper chip data pad, respectively, the memory device having a memory core and an I/O buffer, the I/O buffer including a lower I/O buffer and an upper I/O buffer corresponding to the lower die data pad and the upper die data pad, respectively, the I/O buffer configured to buffer data exchanged between the memory core and the die I/O pads, and the conversion block configured to electrically connect one of the lower I/O buffer and the upper I/O buffer to the die I/O pads associated with a respective one of the semiconductor dies such that the respective one of the plurality of semiconductor dies is electrically connected to the chip command-address pad and a first one of the lower chip data pad and the upper chip data pad while being electrically isolated from a second one of the lower chip data pad and the upper chip data pad.

17. The memory system of claim 16, wherein
the memory controller is configured to control access to the stacked memory chip via a number of chip selection signals and a number of address bit signals,
the number of the chip selection signals transmitted by the memory controller corresponding to a half a number of the plurality of semiconductor dies, and
the number of the address bit signals transmitted by the memory controller corresponding to twice a memory capacity of a respective one of the plurality of semiconductor dies.

18. The memory system of claim 16, wherein
the memory controller is configured to control access to the stacked memory chip through a number of chip selection signals and a number of address bit signals,
the number of the chip selection signals transmitted by the memory controller corresponding to a number of the plurality of the semiconductor dies, and
the number of address bit signals transmitted by the memory controller corresponding to a memory capacity of a respective one of the plurality of semiconductor dies.

19. A memory module comprising:
a substrate; and
a plurality of memory chips mounted on the substrate, each of the memory chips including,
chip input-output (I/O) pads configured to connect to an external device, the chip I/O pads including a chip command-address pad, a lower chip data pad and an upper chip data pad;
a first semiconductor die including first die I/O pads, a first memory device, and a first conversion block, the first die I/O pads including a first die command-address pad, a first lower die data pad and a first upper die data pad corresponding to the chip command-address pad, the lower chip data pad, and the upper chip data pad, respectively, the first memory device having a first memory core and a first I/O buffer, the first I/O buffer including a first lower I/O buffer and a first upper I/O buffer corresponding to the first lower die data pad and the first upper die data pad, respectively, the first I/O buffer configured to buffer data exchanged between the first memory core and the first die I/O pads, and the first conversion block configured to electrically connect one of the first lower I/O buffer and the first upper I/O buffer to the first die I/O pads associated with the first semiconductor die such that the first semiconductor die is electrically connected to the chip command-address pad and the lower chip data pad while being electrically isolated from the upper chip data pad; and
a second semiconductor die including second die I/O pads, a second memory device, and a second conversion block, the second die I/O pads including a second die command-address pad, a second lower die data pad and a second upper die data pad corresponding to the chip command-address pad, the lower chip data pad, and the upper chip data pad, respectively, the second memory device having a second memory core and a second I/O buffer, the second I/O buffer including a second lower I/O buffer and a second upper I/O buffer corresponding to the second lower die data pad and the second upper die data pad, respectively, the second I/O buffer configured to buffer data exchanged between the second memory core and the second die I/O pads, and the second conversion block configured to electrically connect one of the second lower I/O buffer and the second upper I/O buffer to the second die I/O pads associated with the second semiconductor die such that the second semiconductor die is electrically connected to the chip command-address pad and the upper chip data pad while being electrically isolated from the lower chip data pad.

* * * * *